(12) United States Patent
Lee et al.

(10) Patent No.: US 12,464,817 B2
(45) Date of Patent: *Nov. 4, 2025

(54) SEMICONDUCTOR DEVICE AND METHOD

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 20 days.

This patent is subject to a terminal disclaimer.

(21) Appl. No.: 18/404,606

(22) Filed: Jan. 4, 2024

(65) Prior Publication Data
US 2024/0153952 A1  May 9, 2024

Related U.S. Application Data

(63) Continuation of application No. 17/884,052, filed on Aug. 9, 2022, now Pat. No. 11,901,362, which is a
(Continued)

(51) Int. Cl.
*H01L 27/092* (2006.01)
*H01L 21/02* (2006.01)
*H01L 29/06* (2006.01)
*H01L 29/66* (2006.01)
*H01L 29/78* (2006.01)
(Continued)

(52) U.S. Cl.
CPC ....... *H10D 84/853* (2025.01); *H01L 21/0228* (2013.01); *H10D 30/024* (2025.01); *H10D 30/6211* (2025.01); *H10D 62/118* (2025.01)

(58) Field of Classification Search
CPC .... H10D 30/014; H10D 30/024; H10D 30/62; H10D 30/6211; H10D 30/6212; H10D 30/6213; H10D 30/6735; H10D 62/118; H10D 62/119; H10D 62/121;
(Continued)

(56) References Cited

U.S. PATENT DOCUMENTS 9,209,247 B2  12/2015  Colinge et al.
9,236,267 B2  1/2016  De et al.
(Continued)

FOREIGN PATENT DOCUMENTS

KR  20120060582 A  6/2012
KR  20160039524 A  4/2016
(Continued)

*Primary Examiner* — David C Spalla
(74) *Attorney, Agent, or Firm* — Slater Matsil, LLP

(57) ABSTRACT

In an embodiment, a device includes: a channel region; a gate dielectric layer on the channel region; a first work function tuning layer on the gate dielectric layer, the first work function tuning layer including a n-type work function metal; a barrier layer on the first work function tuning layer; a second work function tuning layer on the barrier layer, the second work function tuning layer including a p-type work function metal, the p-type work function metal different from the n-type work function metal; and a fill layer on the second work function tuning layer.

20 Claims, 27 Drawing Sheets

Related U.S. Application Data continuation of application No. 17/182,733, filed on Feb. 23, 2021, now Pat. No. 11,502,081.

(60) Provisional application No. 63/137,326, filed on Jan. 14, 2021.

(51) Int. Cl.
*H10D 30/01* (2025.01)
*H10D 30/62* (2025.01)
*H10D 62/10* (2025.01)
*H10D 84/85* (2025.01)

(58) Field of Classification Search
CPC ........... H10D 84/0158; H10D 84/0193; H10D 84/834; H10D 84/853; H01L 21/0228
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,090,206 B2 | 10/2018 | JangJian et al. | |
| 11,183,574 B2 | 11/2021 | Cheng et al. | |
| 11,502,081 B2 * | 11/2022 | Lee | H10D 84/85 |
| 2016/0099337 A1 | 4/2016 | Cheng et al. | |
| 2017/0148891 A1 * | 5/2017 | Lai | H10D 64/667 |
| 2017/0221889 A1 | 8/2017 | Dasgupta et al. | |
| 2017/0323949 A1 | 11/2017 | Loubet et al. | |
| 2017/0365679 A1 | 12/2017 | None | |
| 2018/0151573 A1 * | 5/2018 | Li | H01L 21/28088 |
| 2018/0261677 A1 | 9/2018 | Lee et al. | |
| 2019/0067125 A1 | 2/2019 | Chiang et al. | |
| 2020/0043808 A1 * | 2/2020 | Bao | H01L 21/3215 |
| 2020/0118889 A1 * | 4/2020 | Bao | H01L 21/28088 |
| 2020/0243522 A1 | 7/2020 | Cheng et al. | |
| 2020/0328213 A1 | 10/2020 | Cheng et al. | |
| 2020/0411387 A1 | 12/2020 | Chiang et al. | |
| 2021/0005604 A1 * | 1/2021 | Ge | H10D 84/0167 |
| 2021/0028291 A1 * | 1/2021 | Park | H10D 64/62 |
| 2021/0408257 A1 | 12/2021 | Thomas et al. | |

FOREIGN PATENT DOCUMENTS

| | | | |
|---|---|---|---|
| KR | 20170049350 A | 5/2017 | |
| KR | 20180102273 A | 9/2018 | |
| KR | 20190024600 A | 3/2019 | |
| TW | 202044589 A | 12/2020 | |

* cited by examiner

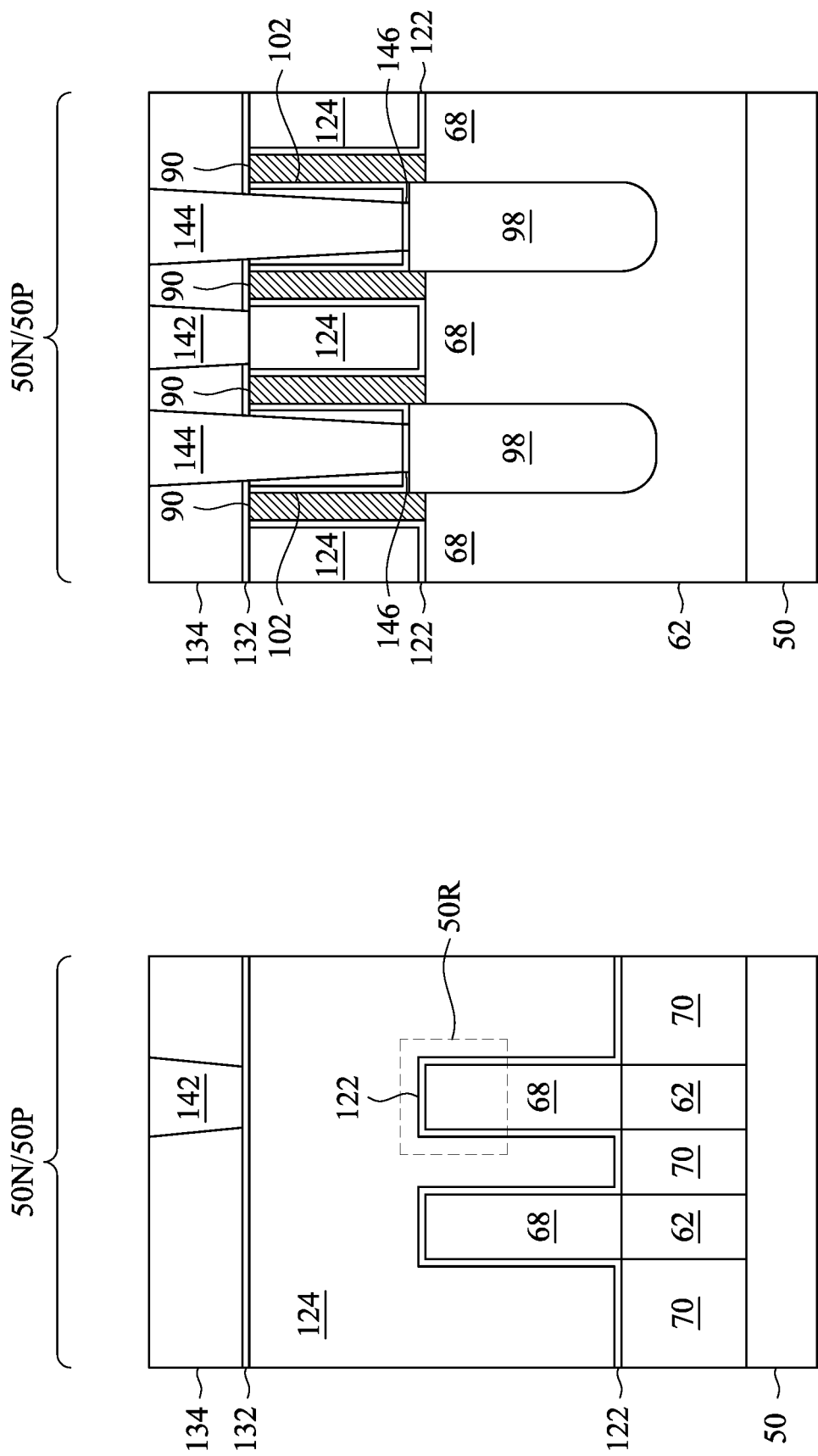

SEMICONDUCTOR DEVICE AND METHOD

PRIORITY CLAIM AND CROSS-REFERENCE

This application is a continuation of U.S. patent application Ser. No. 17/884,052, filed Aug. 9, 2022, entitled "Semiconductor Device and Method," which is a continuation of U.S. patent application Ser. No. 17/182,733, filed Feb. 23, 2021, entitled "Semiconductor Device and Method," now U.S. Pat. No. 11,502,081, issued on Nov. 15, 2022, which claims the benefit of U.S. Provisional Application No. 63/137,326, filed on Jan. 14, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25A through 26B are views of FinFETs, in accordance with some embodiments.

DETAILED DESCRIPTION

Figure 1:
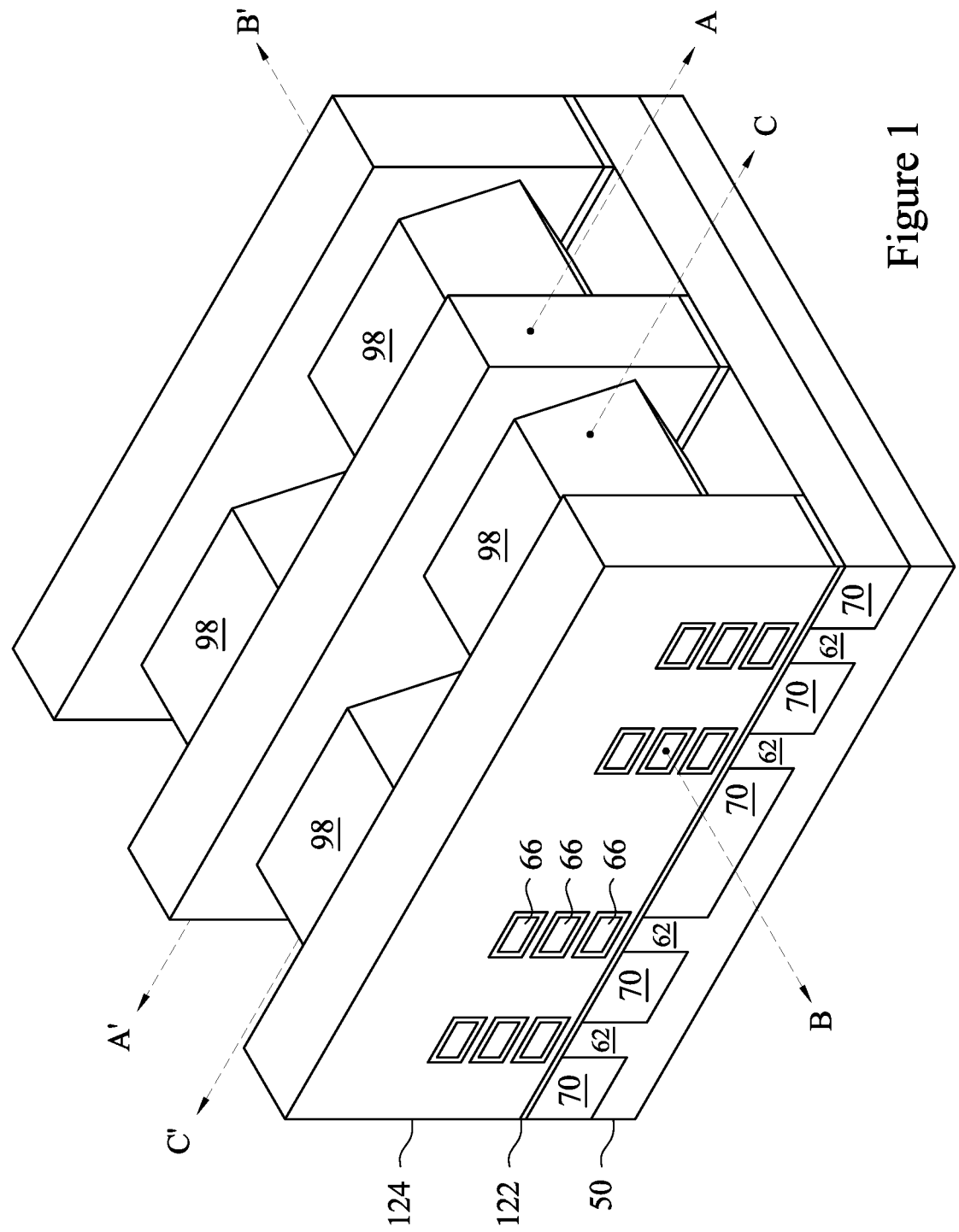
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, gate electrodes are formed with multiple work function tuning layers. A barrier layer is formed between the work function tuning layers, and an upper work function tuning layer is treated to tune its work function. The barrier layer inhibits (e.g., substantially prevents or at least reduces) modification of an underlying work function tuning layer during the treatment. The threshold voltages of the resulting devices may thus be more accurately tuned.

Embodiments are described in a particular context, a die including nano-FETs. Various embodiments may be applied, however, to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a fin 62 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

FIGS. 2 through 23B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 14B, 15A, 15B, 16A, 16B, 17A, 17B, 18A, 18B, 19A, 19B, 20A, 20B, 21A, 22A, and 23A illustrate reference cross-section A-A' illustrated in FIG. 1, except two fins are shown. FIGS. 7B, 8B, 9B, 10B, 11B, 12B, 13B, 21B, 22B, and 23B illustrate reference cross-section B-B' illustrated in FIG. 1. FIGS. 9C and 9D illustrate reference cross-section C-C' illustrated in FIG. 1, except two fins are shown.

Figure 2:
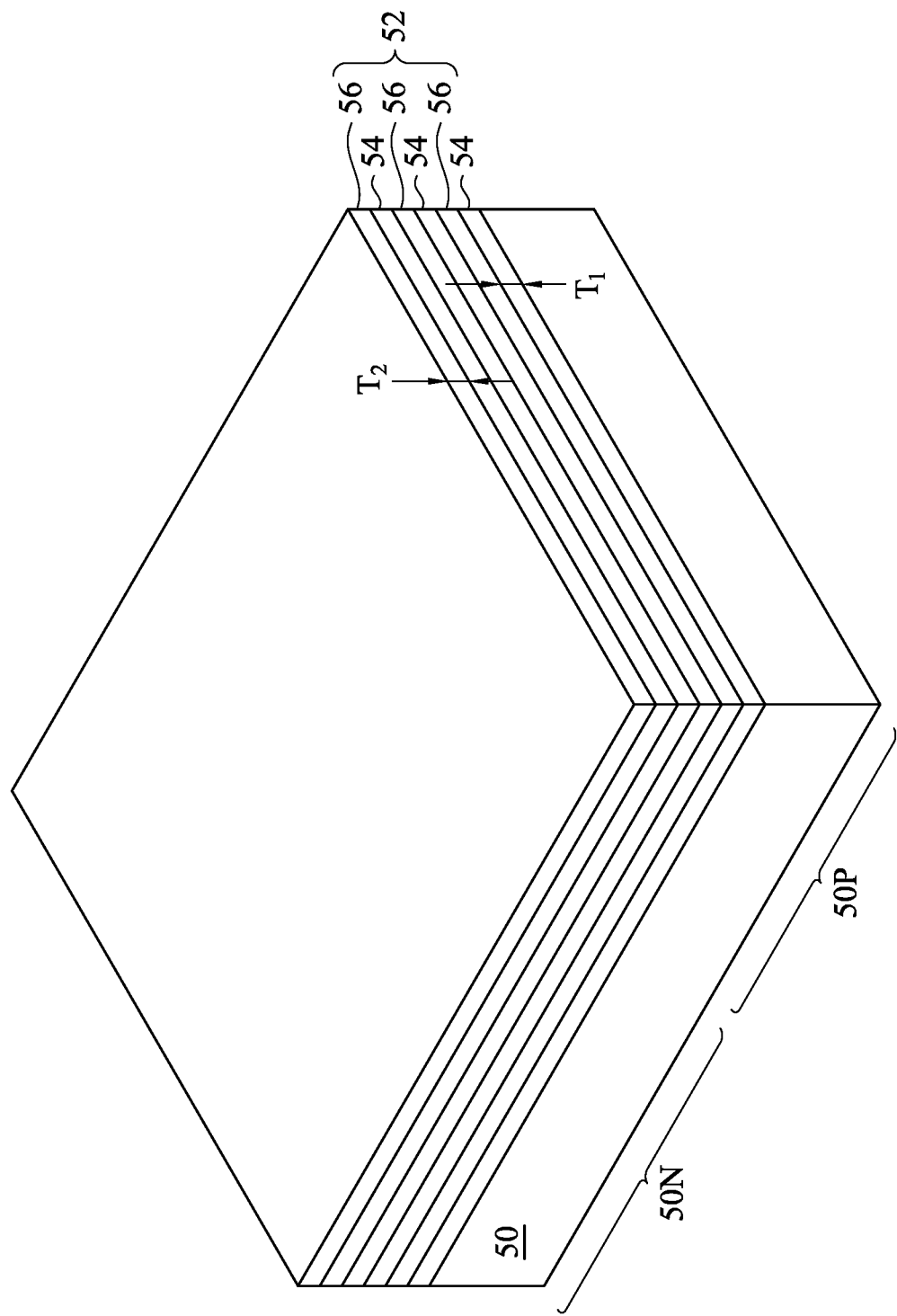
FIGS. 2 through 23B are views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or a n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or a n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of about 5 nm to about 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nano-FETs in both the n-type region 50N and the p-type region 50P, the first semiconductor layers 54 can have a first thickness $T_1$ and the second semiconductor layers 56 can have a second thickness $T_2$, with the second thickness $T_2$ being from about 30% to about 60% less than the first thickness $T_1$. Forming the second semiconductor layers 56 to a smaller thickness allows the channel regions to be formed at a greater density.

Figure 3:
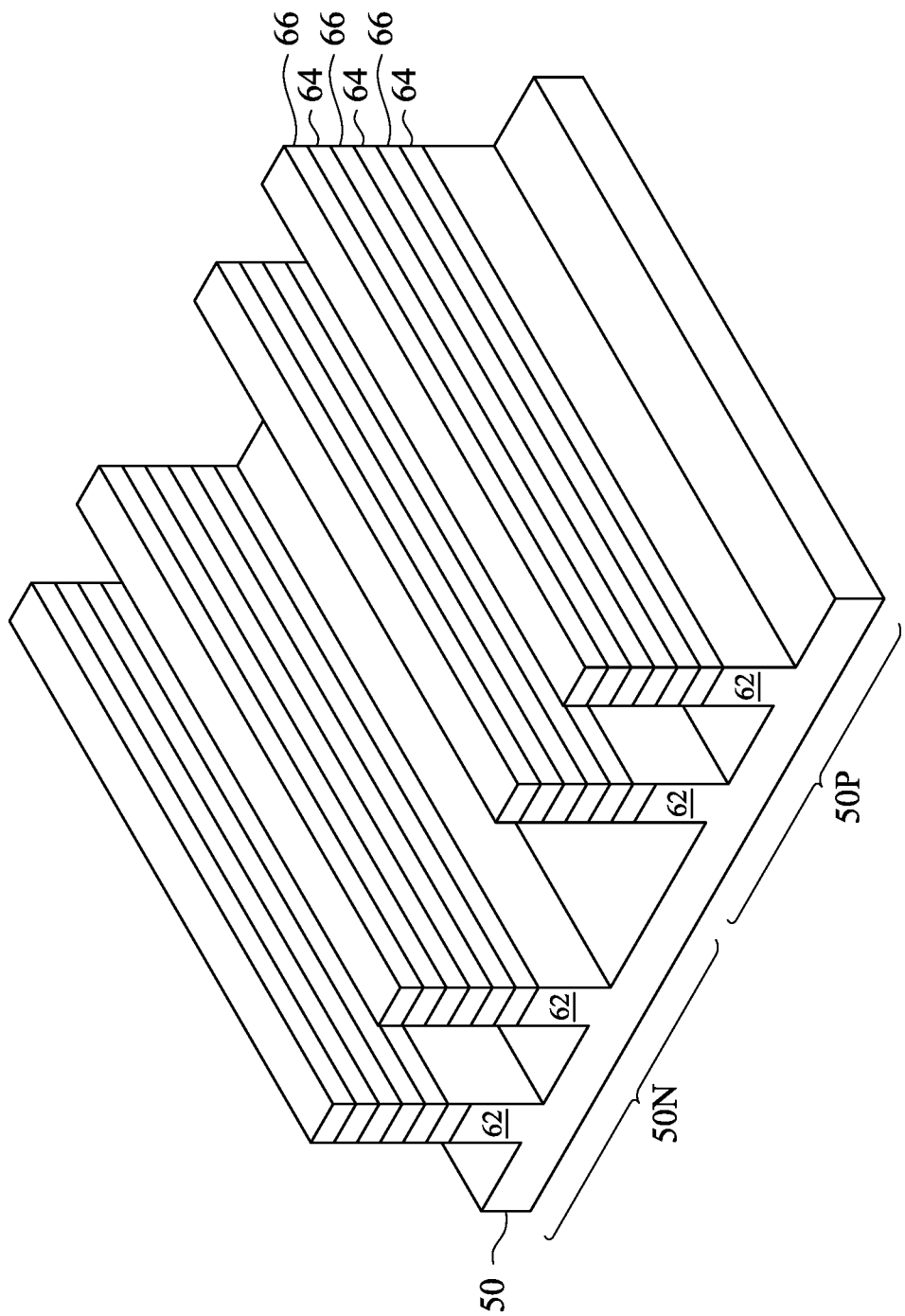

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of about 8 nm to about 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
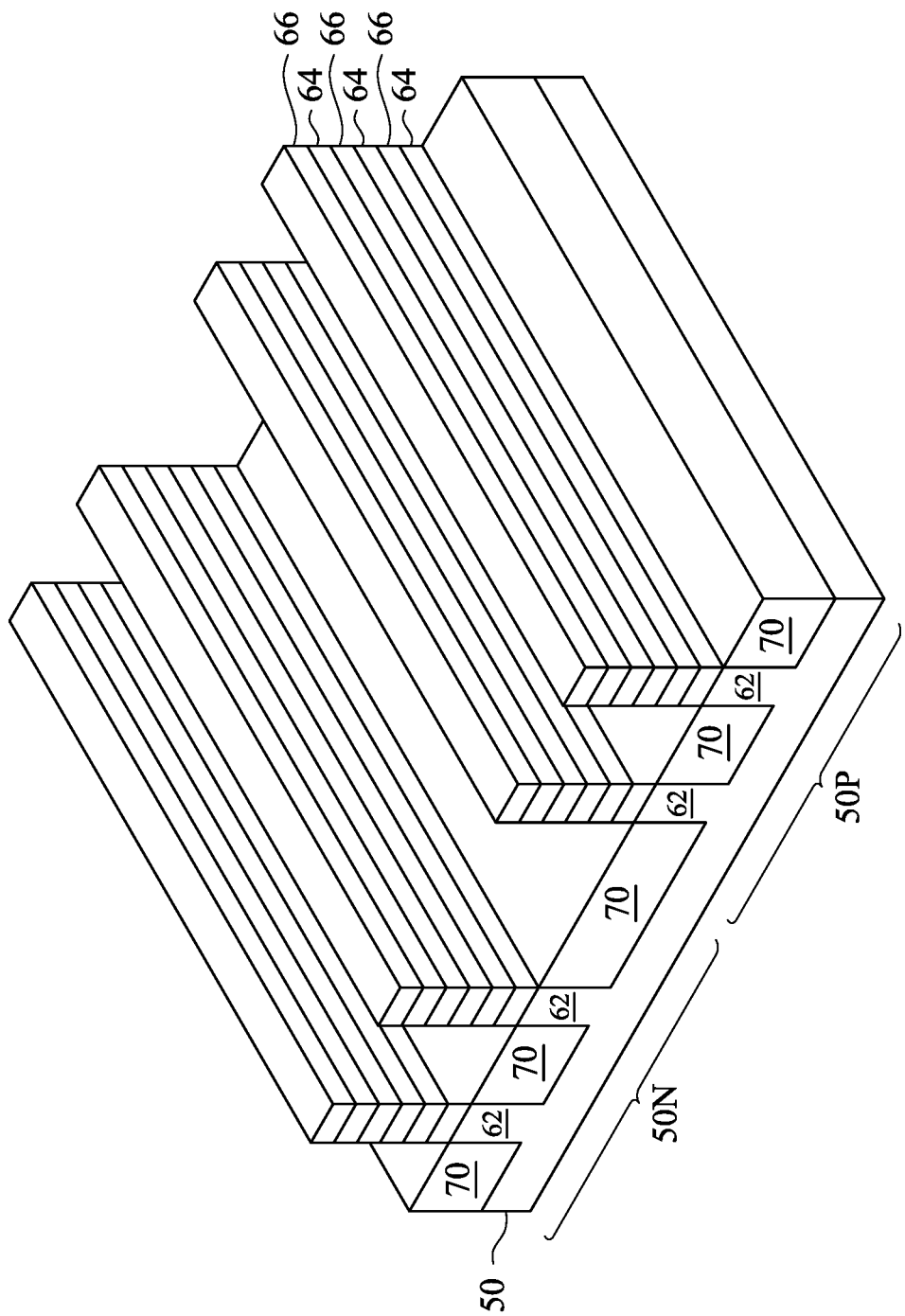

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material are coplanar (within process variations) after the planarization process is complete. In embodiments in which a mask remains on the nanostructures 64, 66, the planarization process may expose the mask or remove the mask such that top surfaces of the mask or the nanostructures 64, 66, respectively, and the insulation material are coplanar (within process variations) after the planarization process is complete. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the substrate 50, the fins 62, and/or the nanostructures 64, 66. The wells may have a conductivity type opposite from a conductivity type of source/drain regions that will be subsequently formed in each of the n-type region 50N and the p-type region 50P. In some embodiments, a p-type well is formed in the n-type region 50N, and a n-type well is formed in the p-type region 50P. In some embodiments, a p-type well or a n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
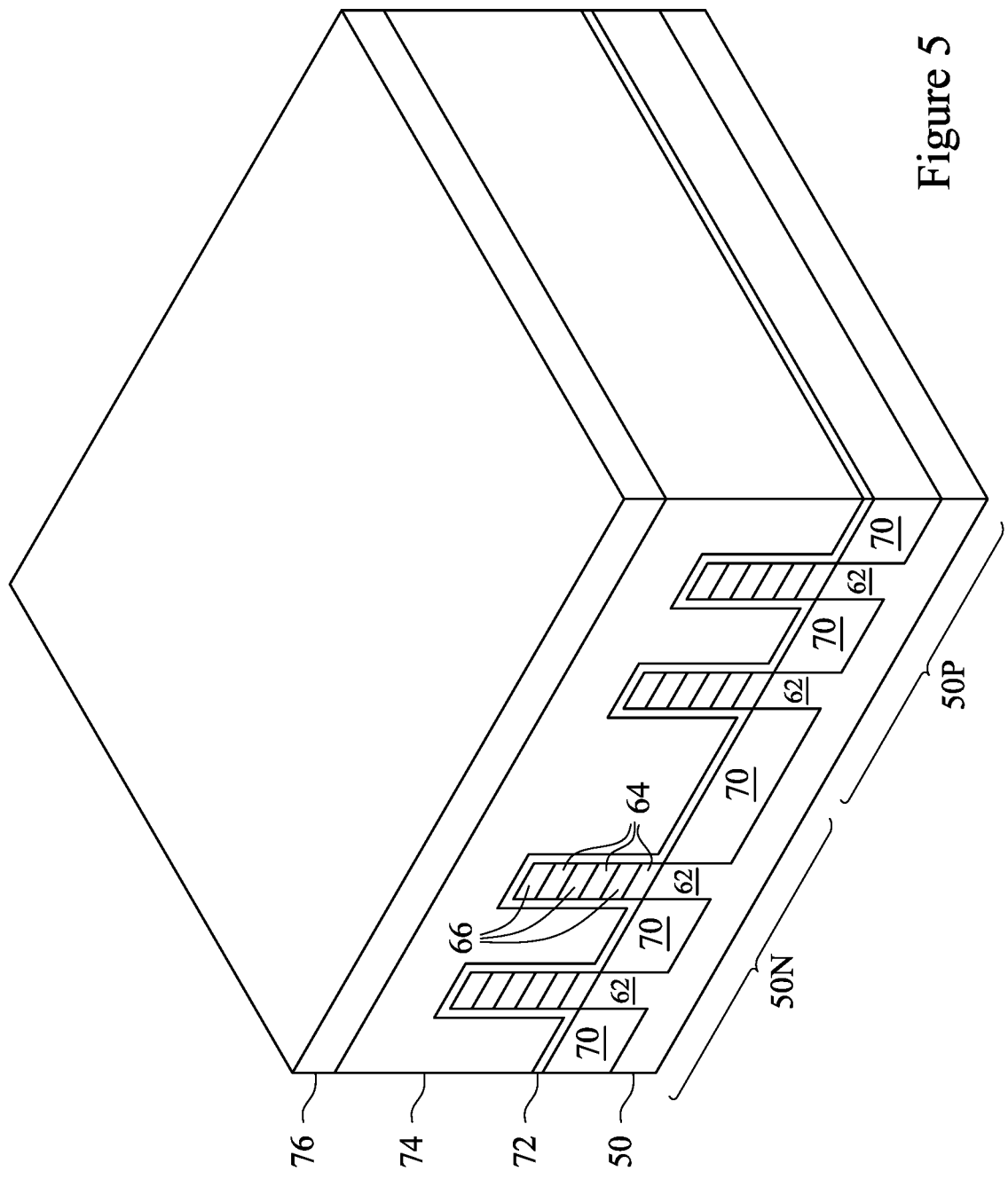

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
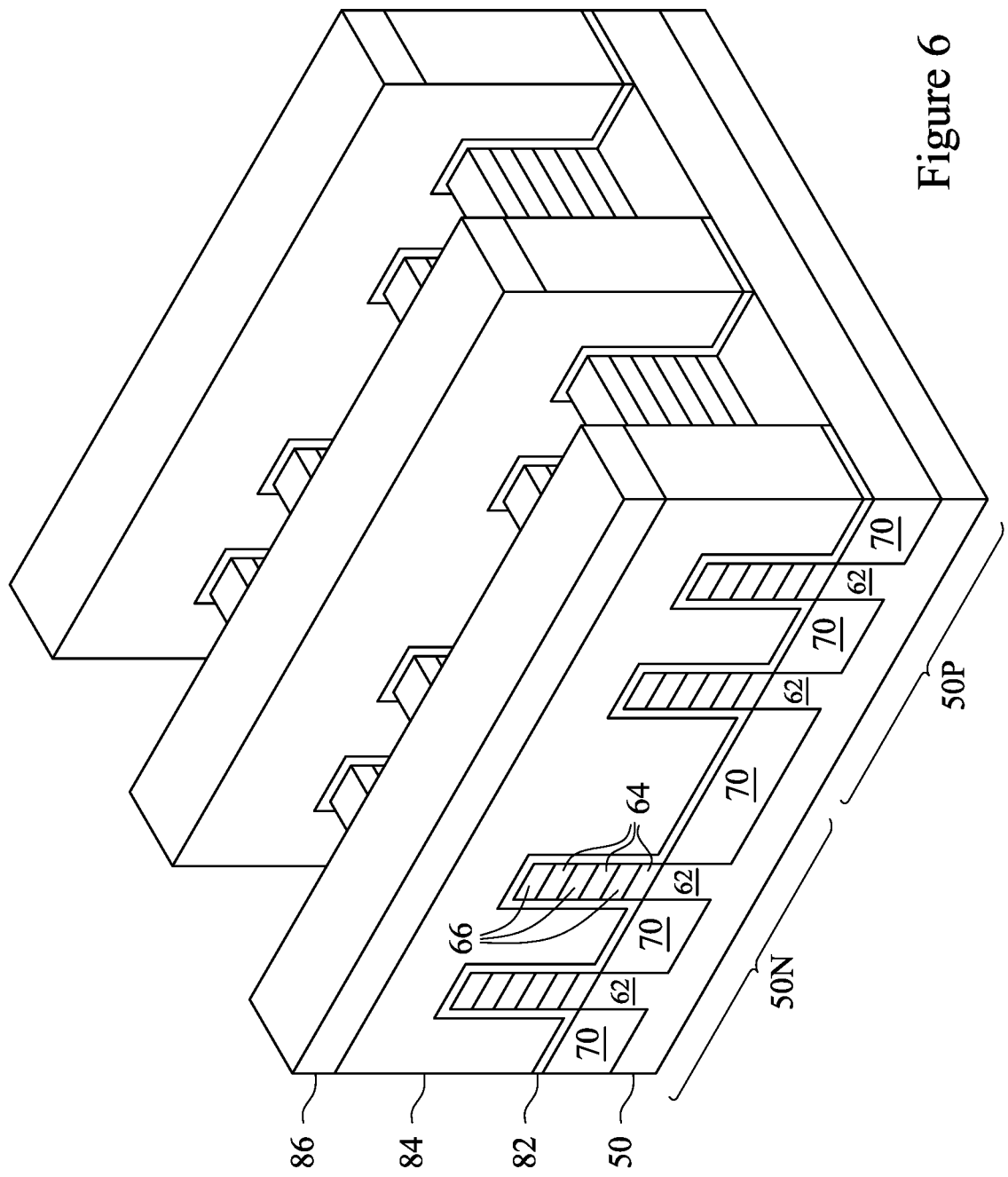

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A through 22B illustrate various additional steps in the manufacturing of embodiment devices. FIGS. 7A through 13B and FIGS. 21A through 22B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. FIGS. 14A, 15A, 16A, 17A, 18A, 19A, and 20A illustrate features in the n-type region 50N. FIGS. 14B, 15B, 16B, 17B, 18B, 19B, and 20B illustrate features in the p-type region 50P.

Figure 7B:
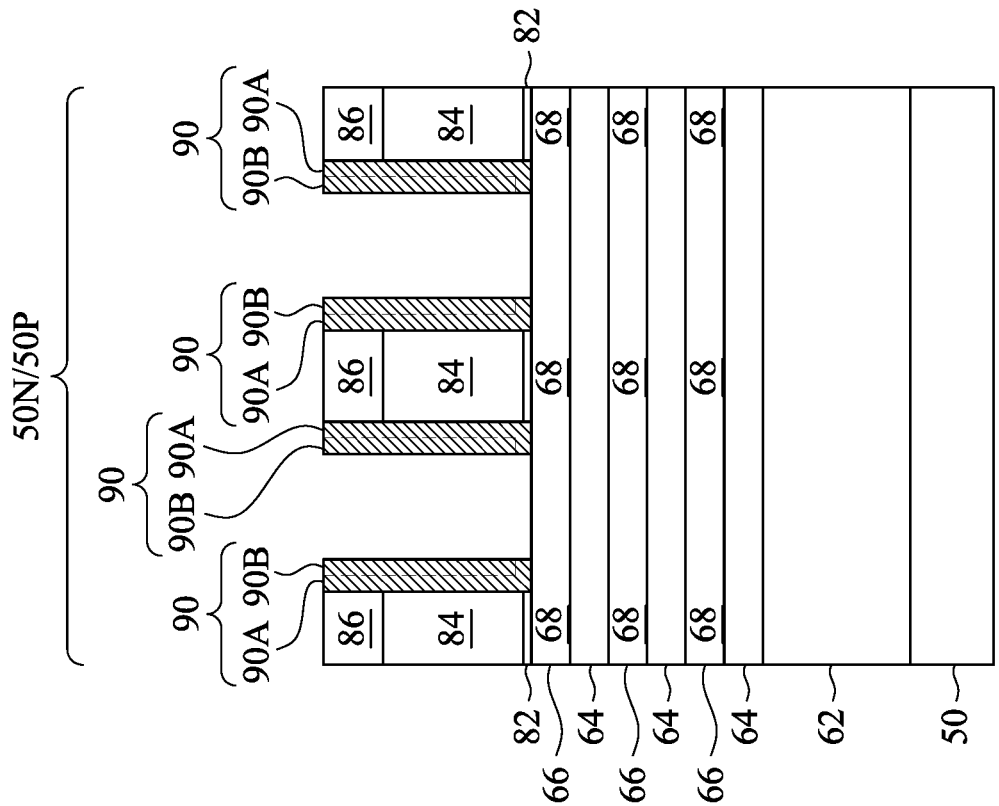
Figure 7A:
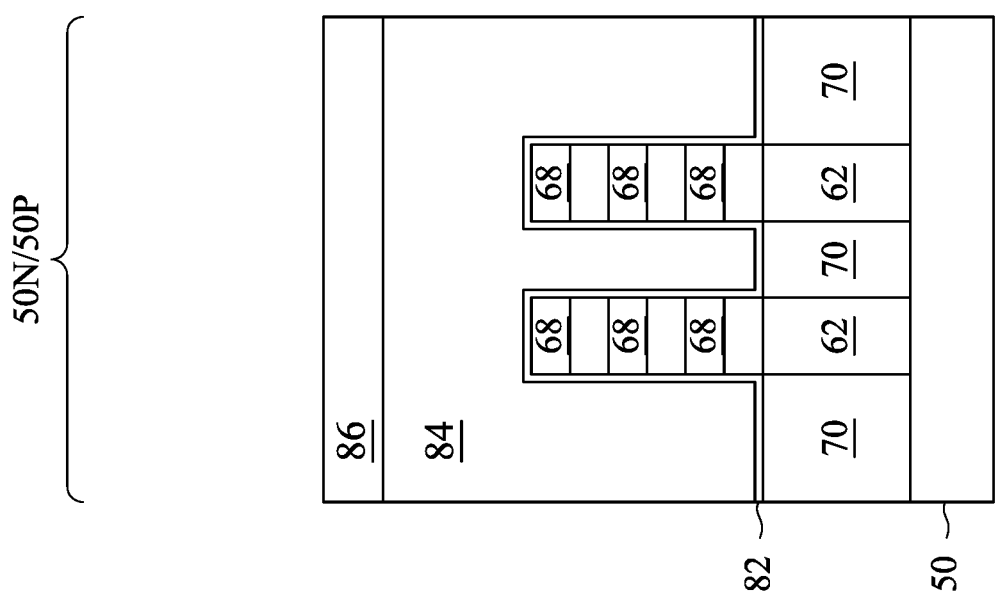

In FIGS. 7A and 7B, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like; multilayers thereof; or the like. The dielectric materials may be formed by a conformal deposition process such as chemical vapor deposition (CVD), plasma enhanced chemical vapor deposition (PECVD), atomic layer deposition (ALD), or the like. In the illustrated embodiment, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1). For example, the first spacer layers 90A can be formed of a similar or a different composition of silicon oxycarbonitride than the second spacer layers 90B. An acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). After etching, the gate spacers 90 can have straight sidewalls (as illustrated) or can have curved sidewalls (not illustrated). As will be subsequently described in greater detail, the dielectric material(s), when etched, may have portions left on the sidewalls of the fins 62 and/or the nanostructures 64, 66 (thus forming fin spacers).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of about $10^{15}$ cm$^{-3}$ to about $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figures 8A, 8B:
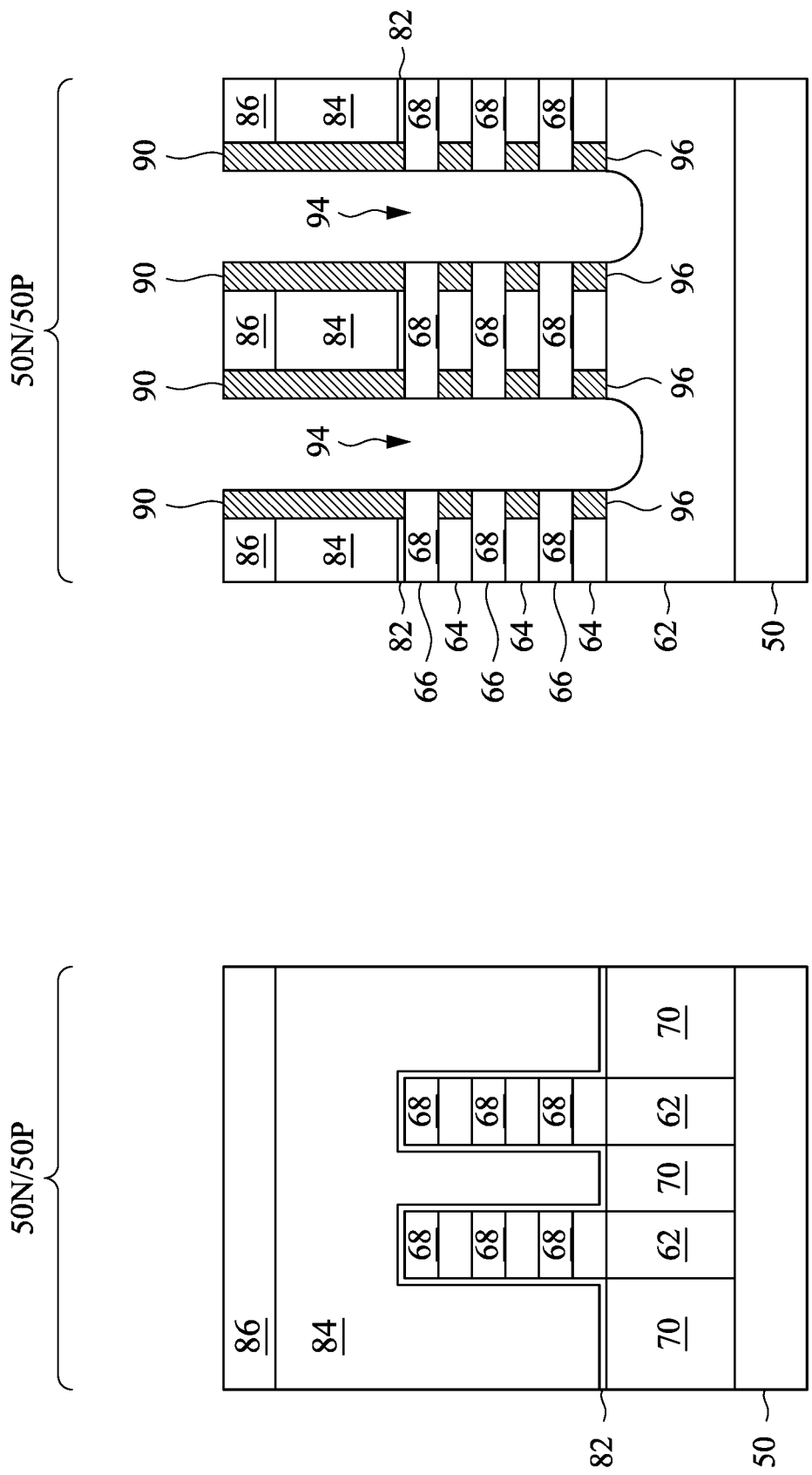

In FIGS. 8A and 8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etching processes, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 9B:
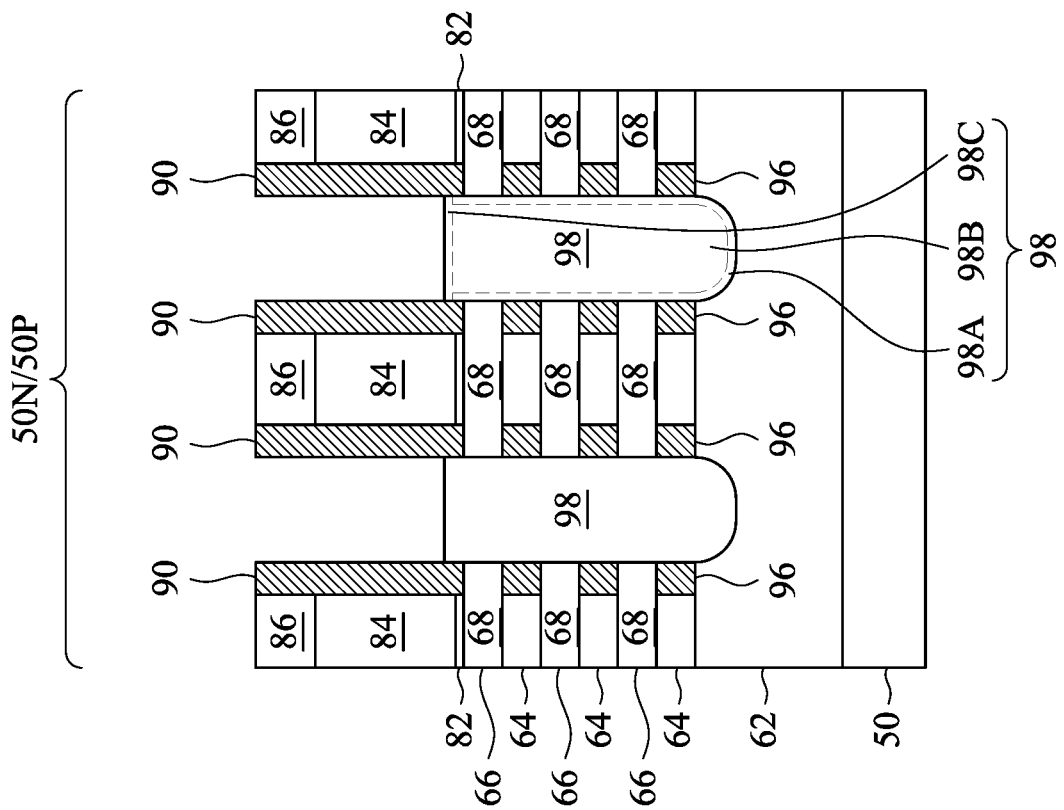
Figure 9A:
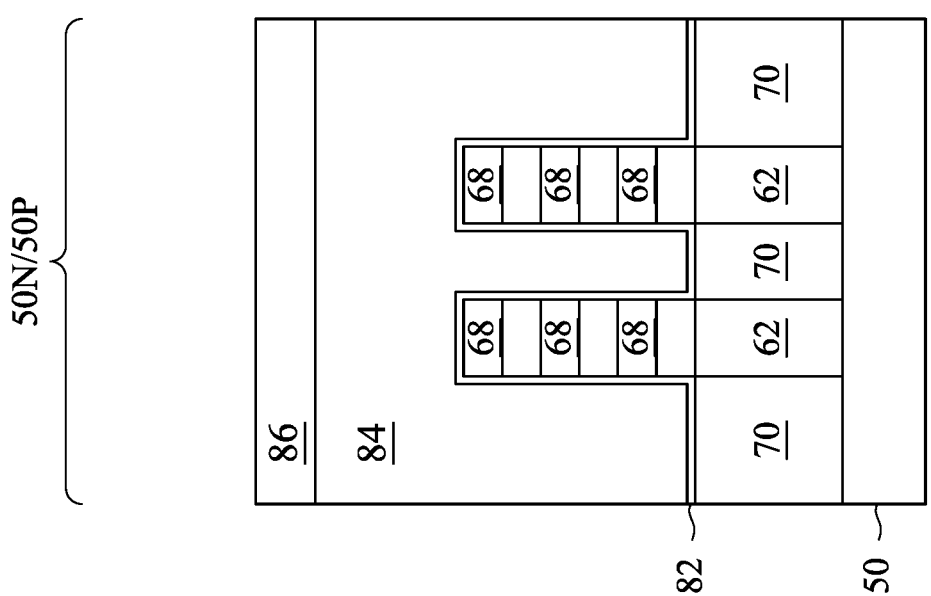
Figure 9D:
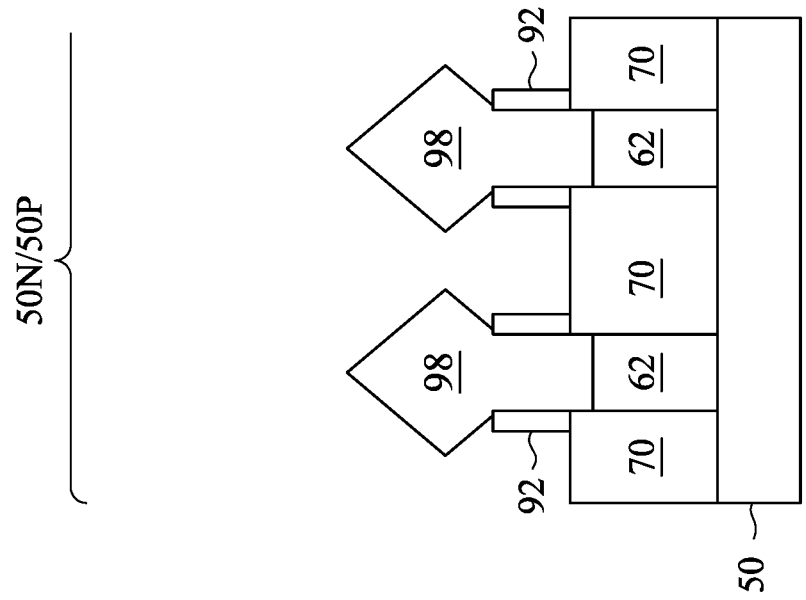
Figure 9C:
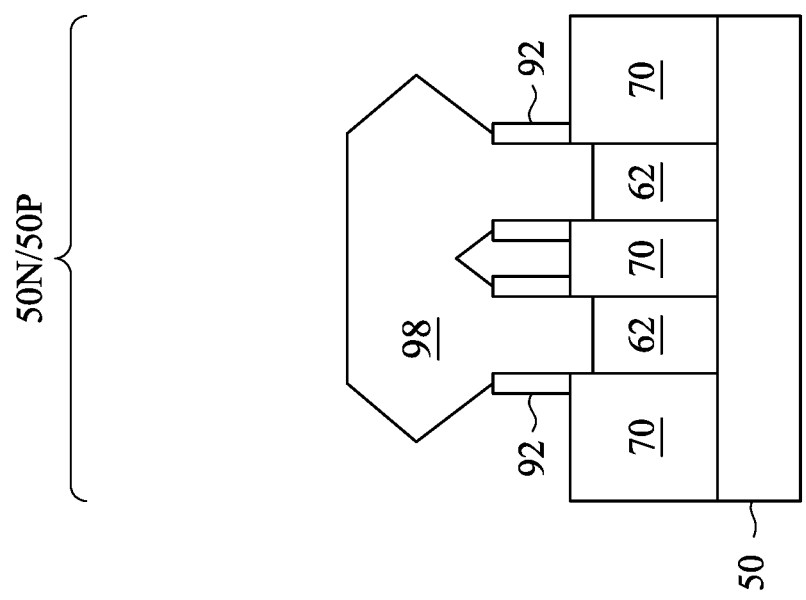

In FIGS. 9A and 9B, epitaxial source/drain regions 98 are formed in the source/drain recesses 94. The epitaxial source/drain regions 98 are formed in the source/drain recesses 94 such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
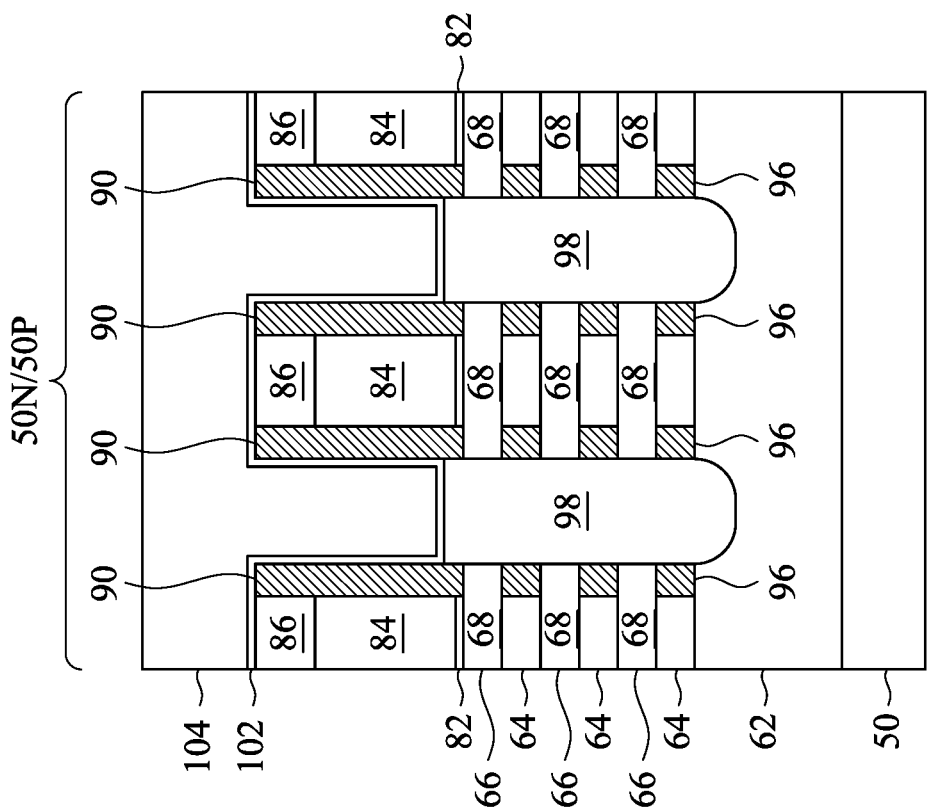
Figure 10A:
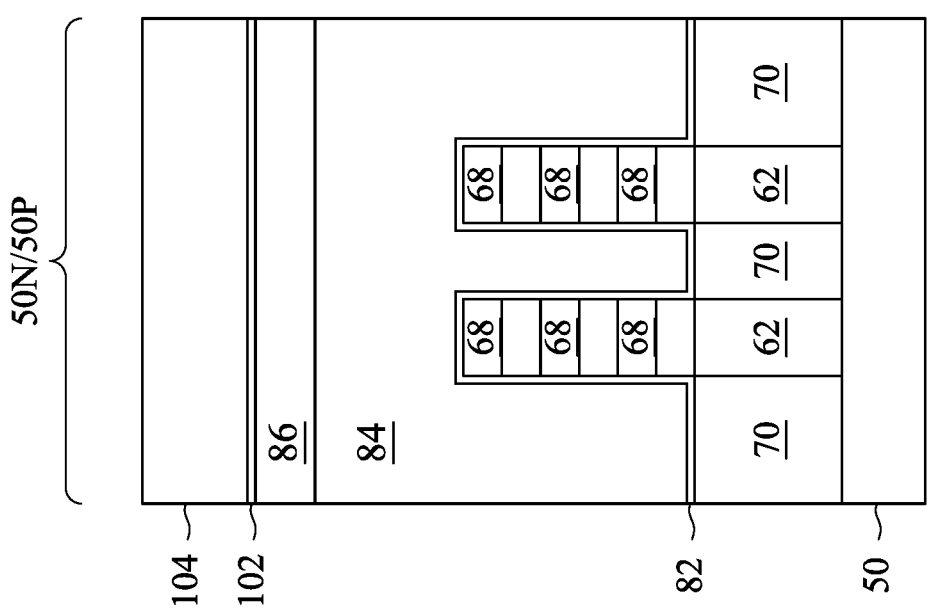

In FIGS. 10A and 10B, a first inter-layer dielectric (ILD) 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 11B:
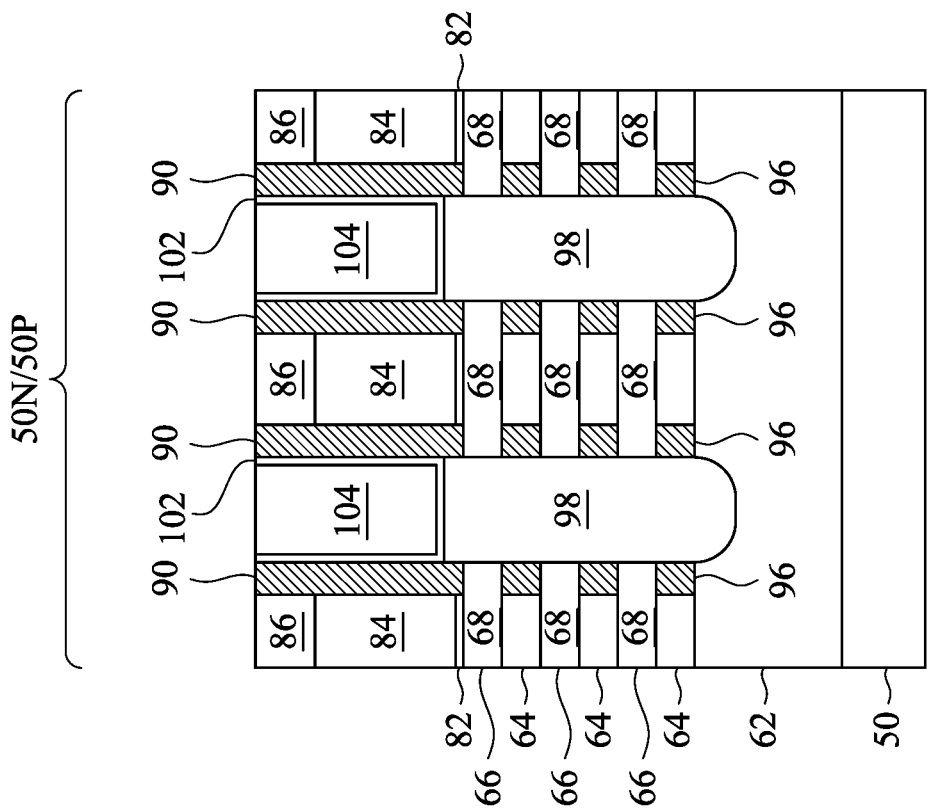
Figure 11A:
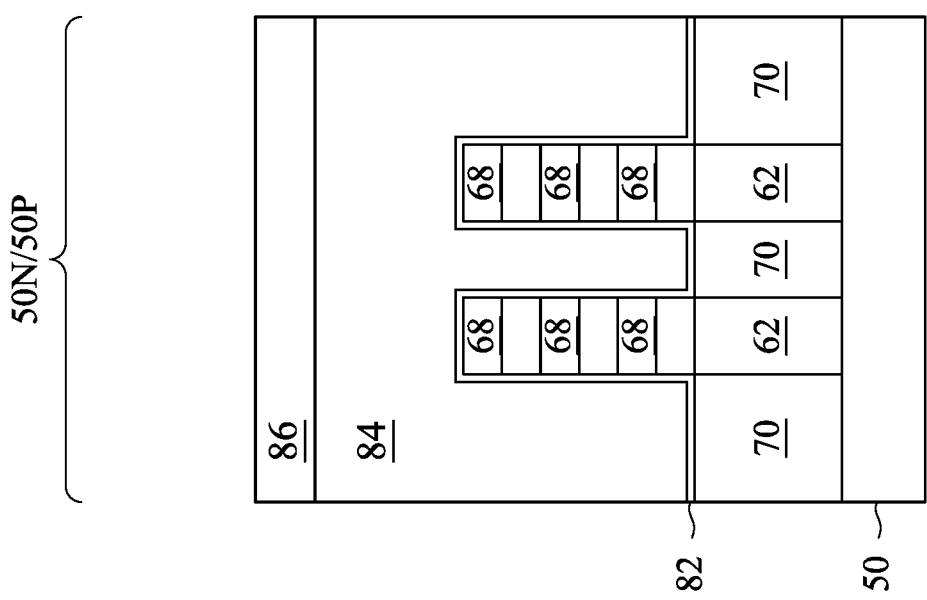

In FIGS. 11A and 11B, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
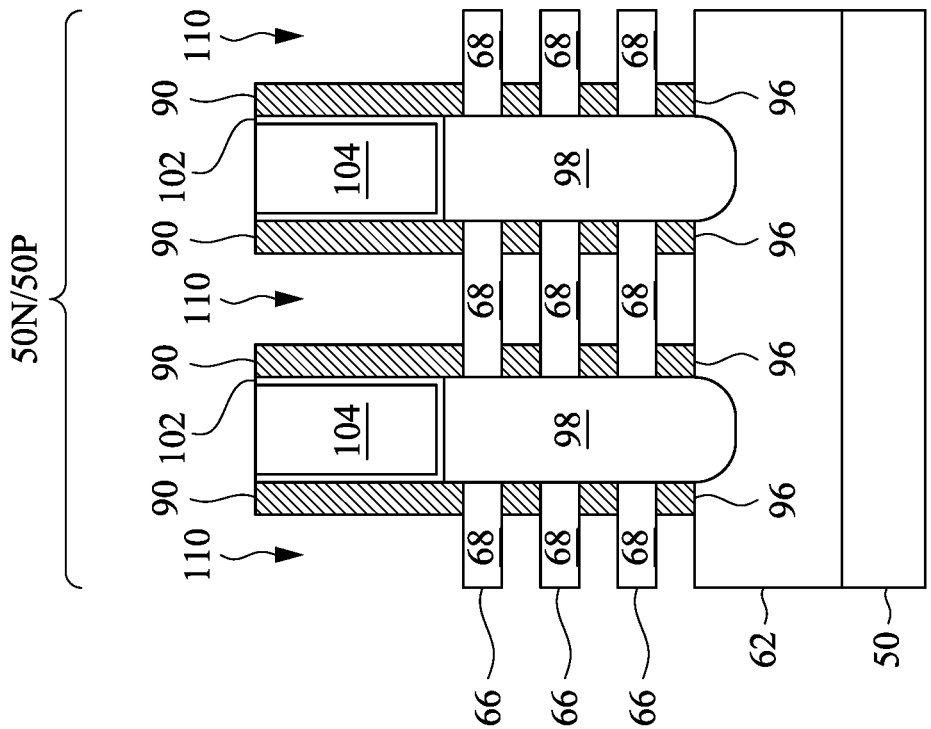
Figure 12A:
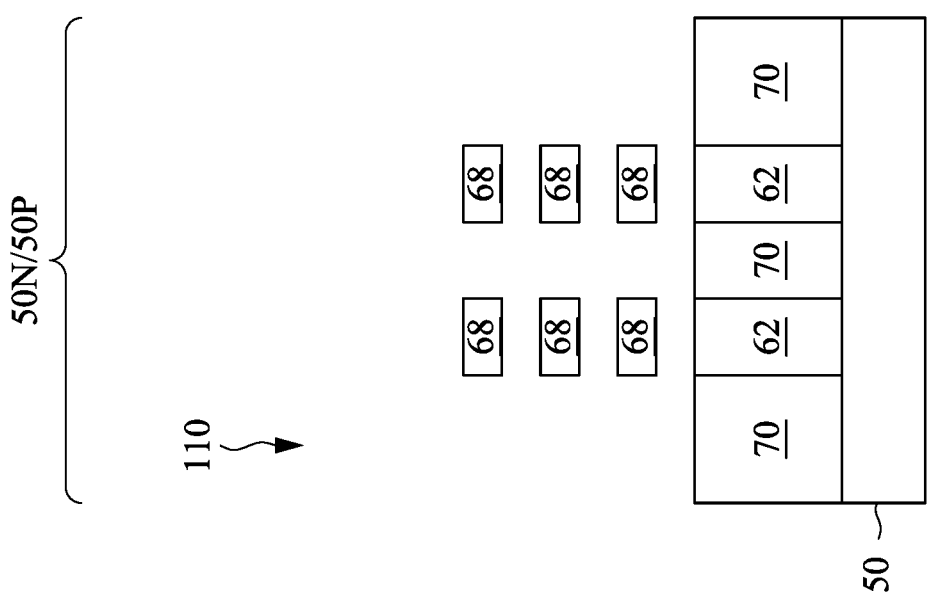

In FIGS. 12A and 12B, the masks 86 (if present) and the dummy gates 84 are removed in an etching process, so that recesses 110 are formed. Portions of the dummy dielectrics 82 in the recesses 110 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 110 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 110. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the second nanostructures 66. As illustrated more clearly in FIGS. 14A through 20B (subsequently described in greater detail), the remaining portions of the second nanostructures 66 can have rounded corners.

Figure 13B:
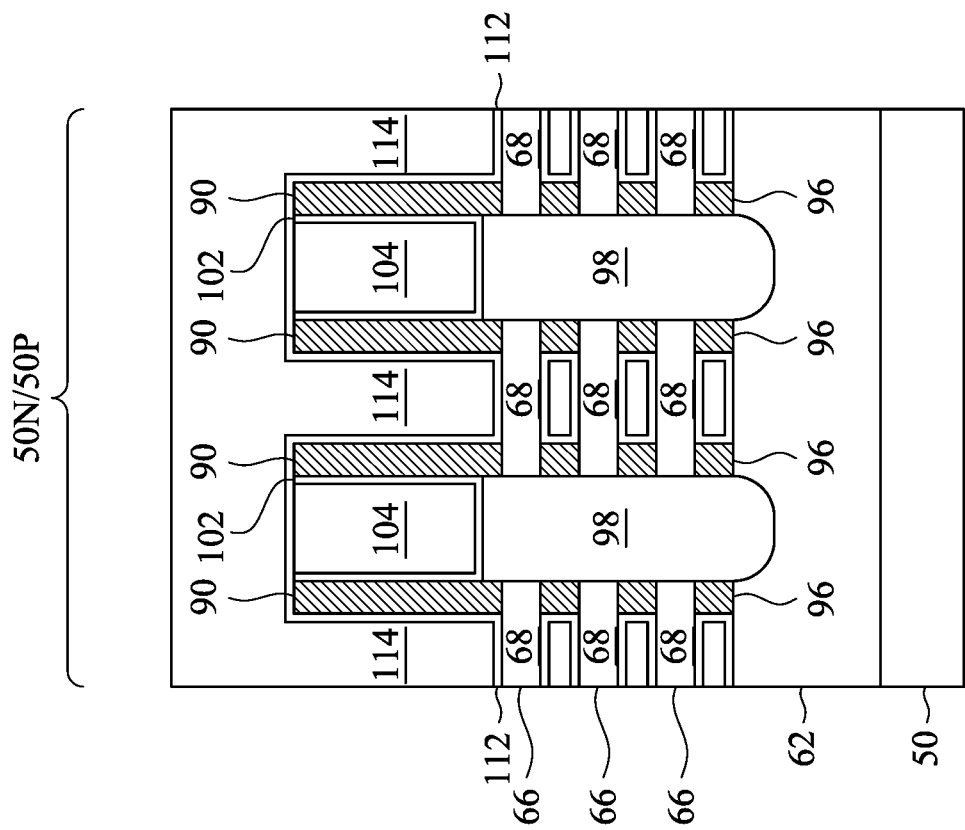
Figure 13A:
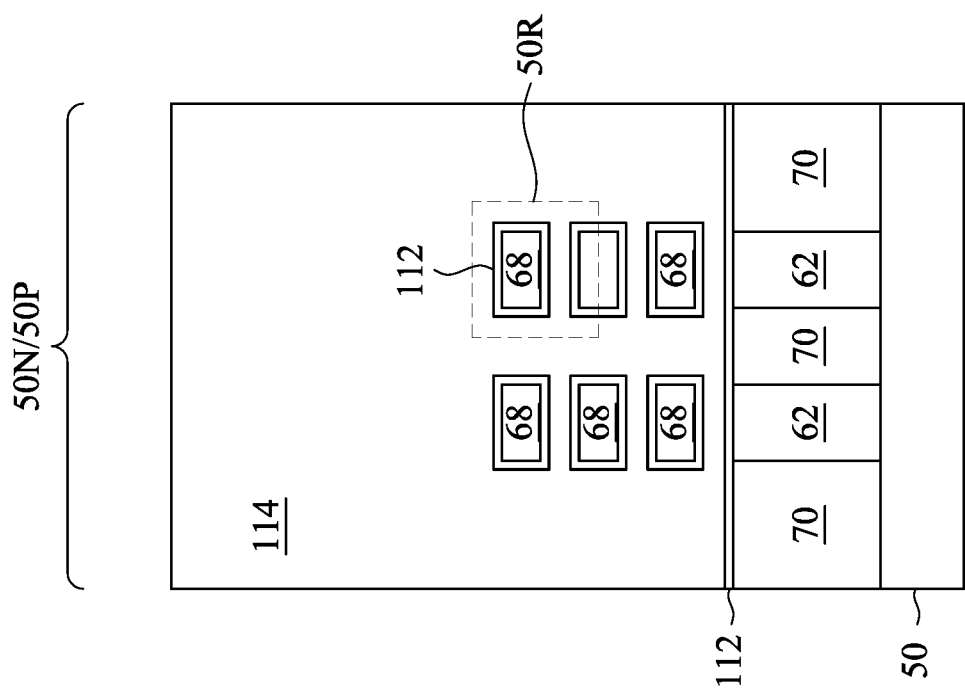

In FIGS. 13A and 13B, a gate dielectric layer 112 is formed in the recesses 110. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single layered gate dielectric layer 112 is illustrated in FIGS. 13A and 13B, as will be subsequently described in greater detail, the gate dielectric layer 112 may include an interfacial layer and a main layer.

The gate electrode layer 114 may include a metal-containing material such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A and 13B, as will be subsequently described in greater detail, the gate electrode layer 114 may include any number of work function tuning layers, any number of barrier layers, any number of glue layers, and a fill material.

Figure 24:
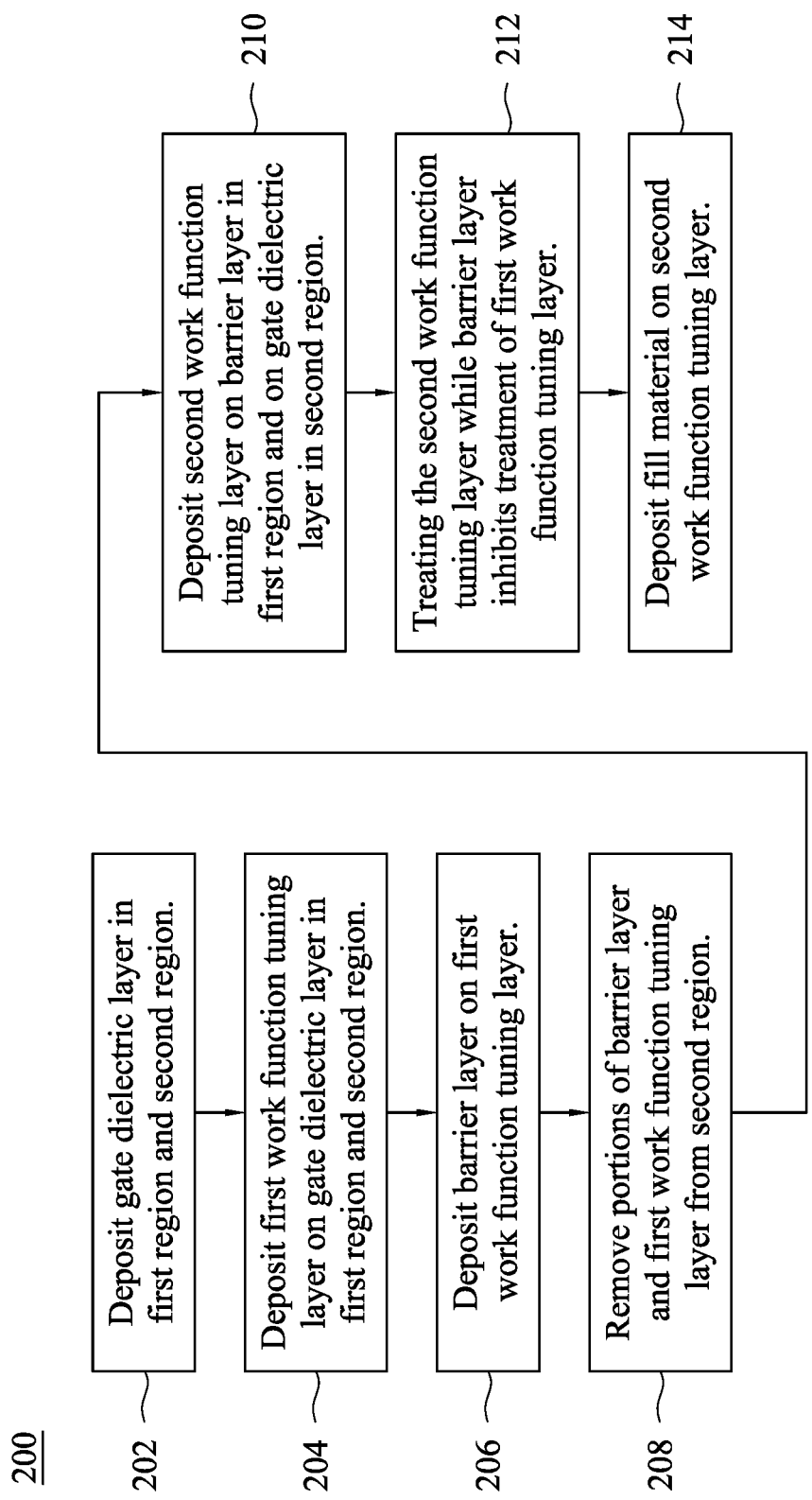
FIG. 24 is a flow chart of an example method for forming replacement gates for nano-FETs, in accordance with some embodiments.
Figure 26B:
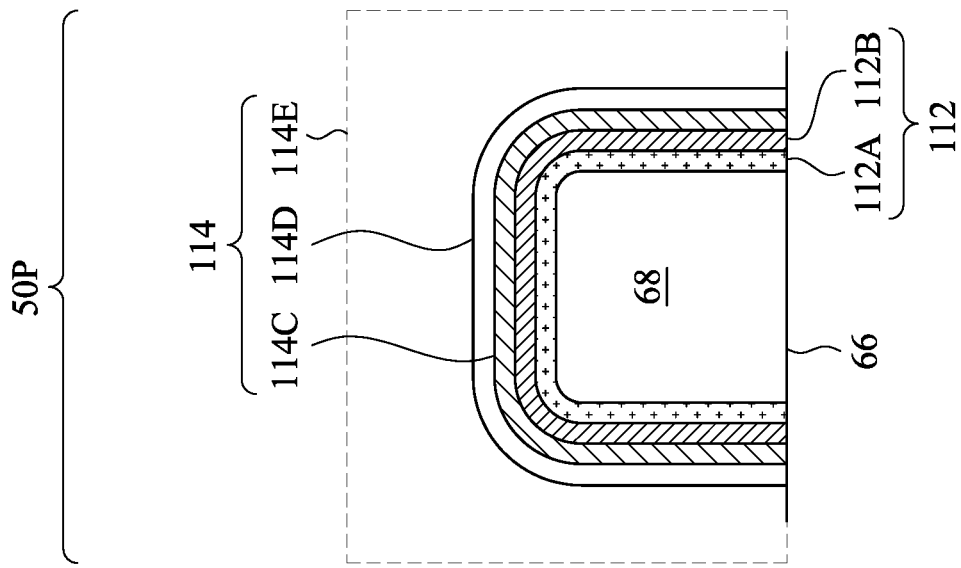
Figure 26A:
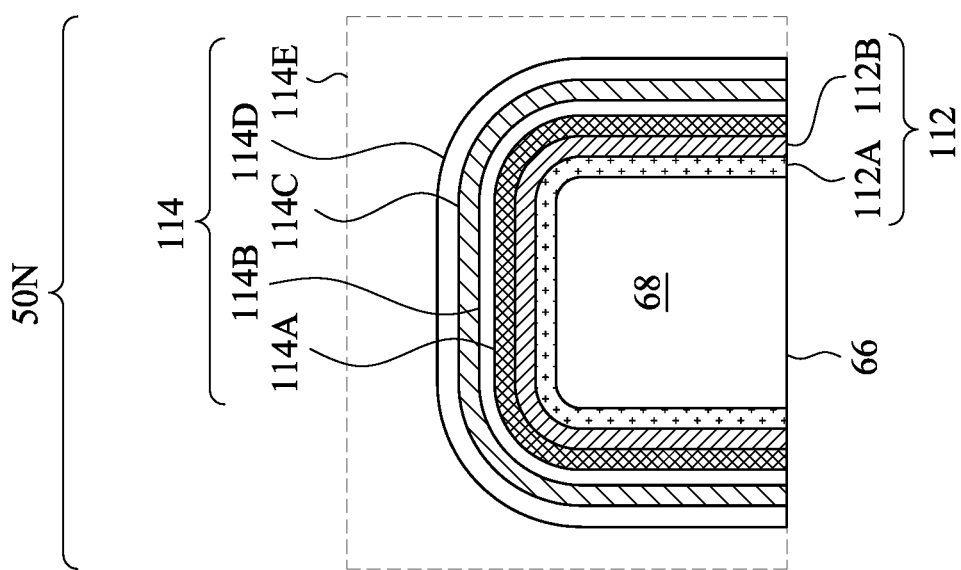

FIGS. 14A through 20B illustrate a process in which layers for replacement gates are formed in the recesses 110. Features in regions that are similar to a region 50R in FIG. 13A are illustrated. FIG. 24 is a flow chart of an example method 200 for forming the replacement gate layers, in accordance with some embodiments. FIGS. 14A through 20B are described in conjunction with FIG. 24. When forming the replacement gate layers, a first work function tuning layer 114A (see FIG. 17A) and a barrier layer 114B (see FIG. 18A) are formed in a first region (e.g., the n-type region 50N). A second work function tuning layer 114C (see FIGS. 18A and 18B) is then formed in both the first region (e.g., the n-type region 50N) and a second region (e.g., the p-type region 50P). Because the first region (e.g., the n-type region 50N) and the second region (e.g., the p-type region 50P) include different quantities and types of work function tuning layers, the devices formed in the regions have different threshold voltages. Further, the barrier layer 114B is disposed between the first work function tuning layer 114A and the second work function tuning layer 114C in the first region (e.g., the n-type region 50N). During processing, the second work function tuning layer 114C is treated. The barrier layer 114B protects the underlying first work function tuning layer 114A so that its work function is not modified during treatment of the second work function tuning layer 114C. The threshold voltages of the resulting devices may thus be more accurately tuned.

Figure 14B:
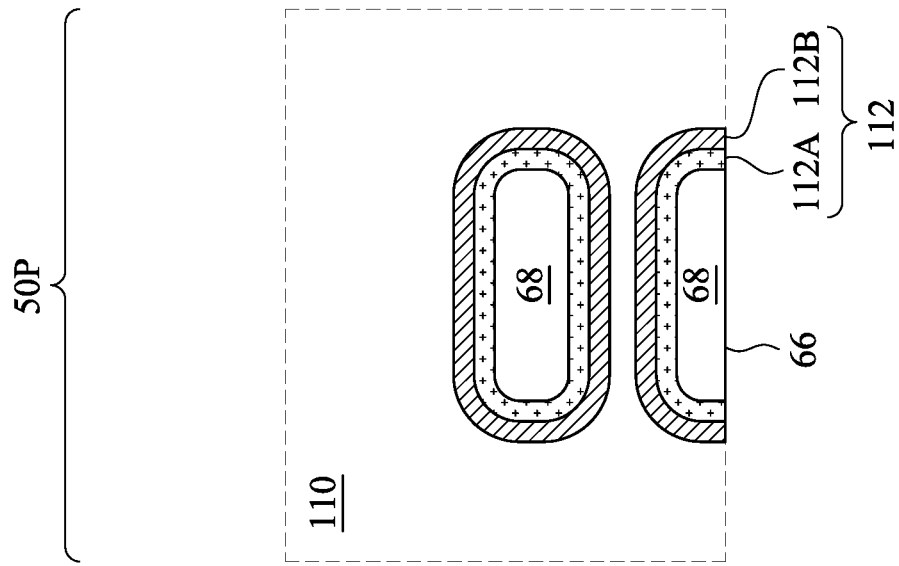
Figure 14A:
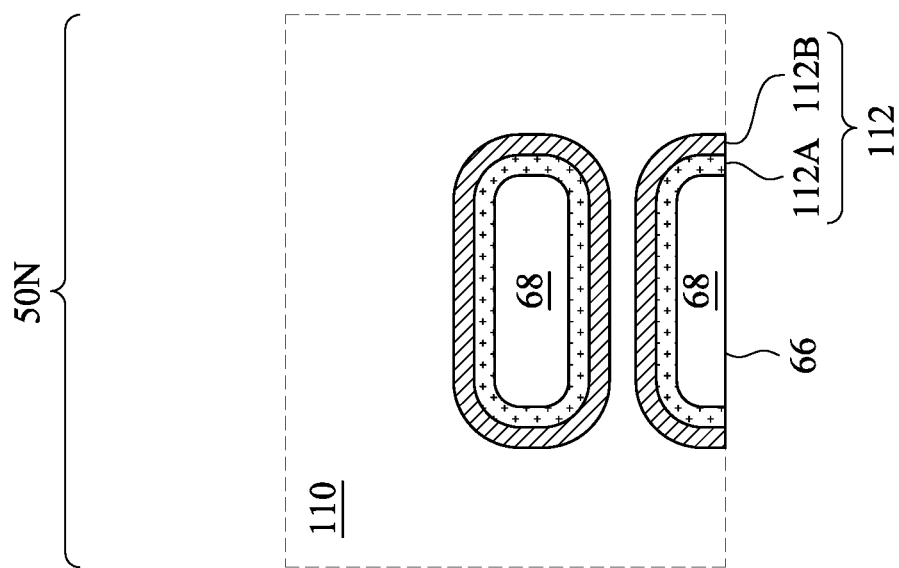

In FIGS. 14A and 14B and step 202 of the method 200, the gate dielectric layer 112 is deposited in the recesses 110 in both the first region (e.g., the n-type region 50N) and the second region (e.g., the p-type region 50P). The gate dielectric layer 112 may also be deposited on the top surfaces of the first ILD 104 and the gate spacers 90 (see FIG. 13B). In the illustrated embodiment, the gate dielectric layer 112 is multilayered, including an interfacial layer 112A (or more generally, a first gate dielectric layer) and an overlying high-k dielectric layer 112B (or more generally, a second gate dielectric layer). The interfacial layer 112A may be formed of silicon oxide and the high-k dielectric layer 112B may be formed of hafnium oxide. The formation methods of the gate dielectric layer 112 may include molecular-beam deposition (MBD), ALD, PECVD, and the like. The gate dielectric layer 112 wraps around all (e.g., four) sides of the second nanostructures 66.

Figure 15B:
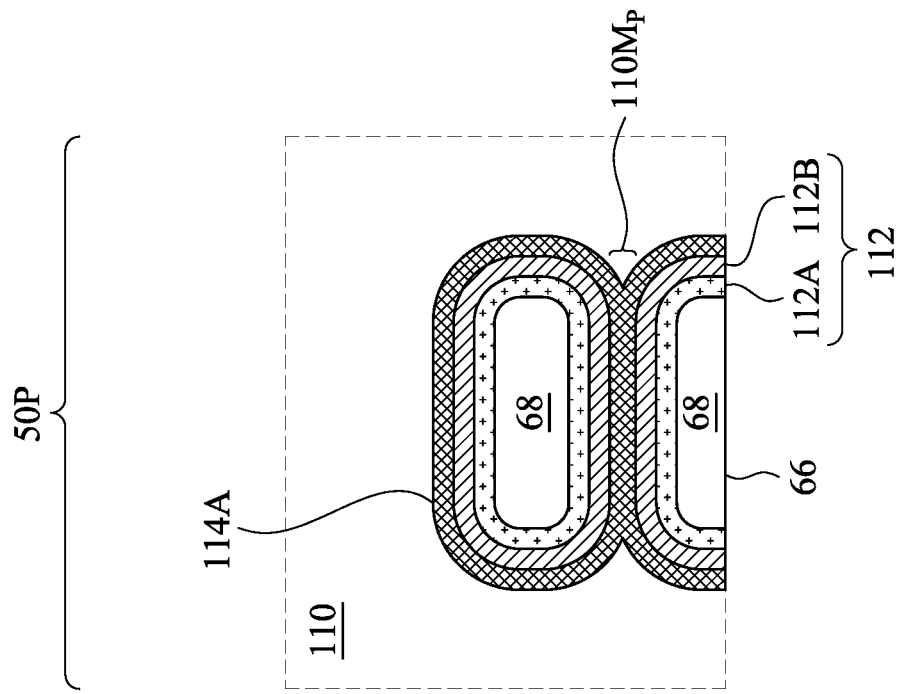
Figure 15A:
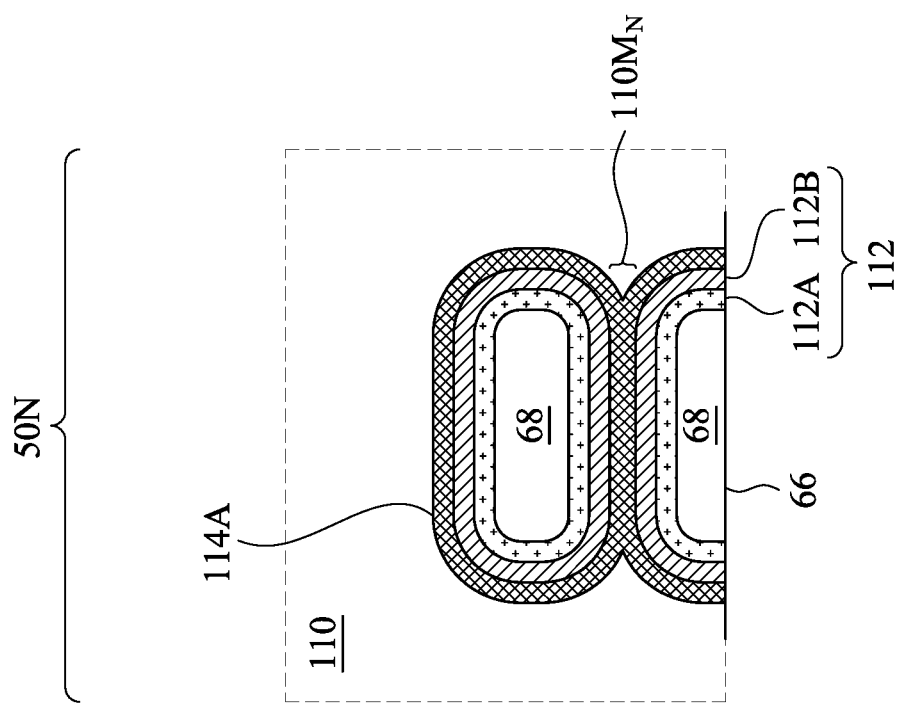

In FIGS. 15A and 15B and step 204 of the method 200, a first work function tuning layer 114A is deposited on the gate dielectric layer 112 in both the first region (e.g., the n-type region 50N) and the second region (e.g., the p-type region 50P). As will be subsequently described in greater detail, the first work function tuning layer 114A will be patterned to remove portions of the first work function tuning layer 114A in the second region (e.g., the p-type region 50P) while leaving portions of the first work function tuning layer 114A in the first region (e.g., the n-type region 50N). The first work function tuning layer 114A may be referred to as a "n-type work function tuning layer" when it is removed from the second region (e.g., the p-type region 50P). The first work function tuning layer 114A includes any acceptable material to tune a work function of a device to a desired amount given the application of the device to be formed, and may be deposited using any acceptable deposition process. For example, when the first work function tuning layer 114A is a n-type work function tuning layer, it may be formed of a n-type work function metal (NWFM) such as titanium aluminum (TiAl), titanium aluminum carbide (TiAlC), titanium aluminum nitride (TiAlN), combinations thereof, or the like, which may be deposited by ALD, CVD, PVD, or the like. Although the first work function tuning layer 114A is shown as being single layered, the first work function tuning layer 114A can be multilayered. For example, the first work function tuning layer 114A can include a layer of titanium aluminum nitride (TiAlN) and a layer of titanium nitride (TiN).

The first work function tuning layer 114A is formed to a thickness that is sufficient to cause merging of the portions of the first work function tuning layer 114A between the second nanostructures 66 in both the first region (e.g., the n-type region 50N) and the second region (e.g., the p-type region 50P). As a result, the portions $110M_N$, $110M_P$ of the recesses 110 between the second nanostructures 66 are completely filled by the first work function tuning layer 114A, so that no barrier layers (subsequently described in greater detail) can be formed in the portions $110M_N$, $110M_P$ of the recesses 110 between the second nanostructures 66. By not depositing barrier layers between the second nanostructures 66, manufacturing ease can be improved, particularly in advanced semiconductor nodes with small feature sizes, as barrier layer materials can be difficult to deposit in small spaces. Respective portions of the gate dielectric layer 112 wrap around each of the second nanostructures 66, and respective portions of the first work function tuning layer 114A fill areas between the respective portions of the gate dielectric layer 112 in both the first region (e.g., the n-type region 50N) and the second region (e.g., the p-type region 50P). In some embodiments, the first work function tuning layer 114A is formed to a thickness in a range of about 5 Å to about 40 Å, such as in a range of about 20 Å to about 25 Å. Forming the first work function tuning layer 114A to a thickness of less than about 20 Å may not result in merging of portions of the first work function tuning layer 114A. Forming the first work function tuning layer 114A to a thickness of greater than about 25 Å may negatively impact the threshold voltages of the resulting devices.

Figure 16B:
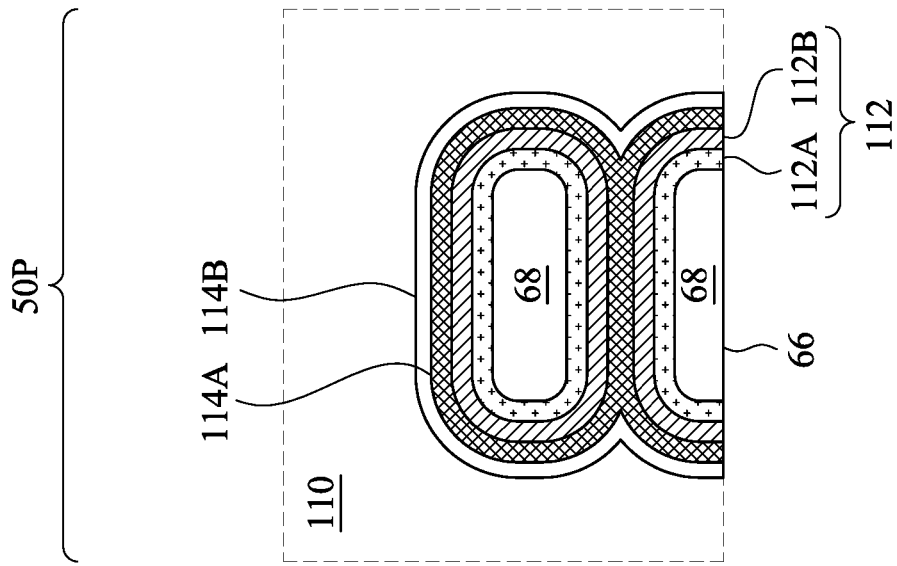
Figure 16A:
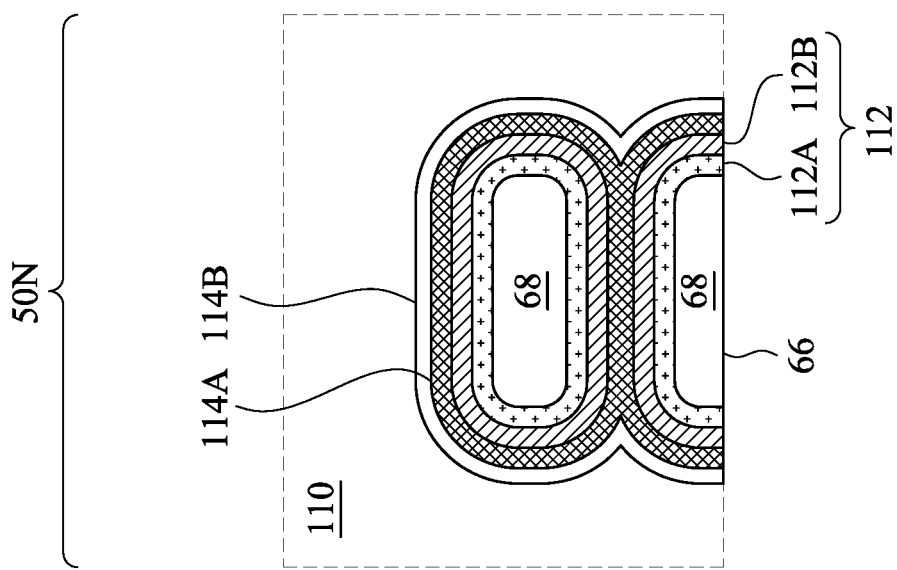

In FIGS. 16A and 16B and step 206 of the method 200, a barrier layer 114B is deposited on the first work function tuning layer 114A. As will be subsequently described in greater detail, a second work function tuning layer will be formed over the barrier layer 114B, and a treatment process will be performed to modify the work function of the second work function tuning layer. The barrier layer 114B is formed of a barrier material that is resistant to the treatment process, thus inhibiting (e.g., substantially preventing or at least reducing) modification of the work function of the first work function tuning layer 114A. In some embodiments, the treatment process includes a fluorination process and/or an oxidation process, and the barrier layer 114B is formed of a barrier material that is resistant to fluorination and/or oxidation, thereby inhibiting fluorination and/or oxidation of the first work function tuning layer 114A. As subsequently described in greater detail, suitable barrier materials include amorphous silicon, tantalum nitride, fluorine-free tungsten, or the like, which may be deposited by CVD, ALD, or the like.

The barrier layer 114B is formed to a thickness that is sufficient to inhibit modification of the work function of the first work function tuning layer 114A during subsequent processing. In some embodiments, the barrier layer 114B is formed to a thickness in a range of about 15 Å to about 80 Å. Forming the barrier layer 114B to a thickness of less than about 15 Å may not sufficiently protect the first work function tuning layer 114A. Forming the barrier layer 114B to a thickness of greater than about 80 Å may negatively impact the threshold voltages of the resulting devices. The barrier layer 114B may have a lesser thickness than the first work function tuning layer 114A.

In some embodiments, the barrier layer 114B is formed of amorphous silicon, which is deposited by a CVD process. Specifically, the barrier layer 114B may be formed by placing the substrate 50 in a deposition chamber and dispensing a silicon source precursor into the deposition chamber. Acceptable silicon source precursors include binary silicon-hydrogen compound silanes such as silane ($SiH_4$), disilane ($Si_2H_6$), and the like. The CVD process can be performed at a temperature in the range of about 300° C. to about 500° C. and at a pressure in the range of about 2 torr to about 35 torr, e.g., by maintaining the deposition chamber at such a temperature and pressure. The CVD process can be performed for a duration in the range of about 5 seconds to about 750 seconds, e.g., by keeping the silicon source precursor in the deposition chamber for such a duration. Performing the CVD process with parameters in these ranges allows the barrier layer 114B to be formed to a desired thickness (previously described) and quality. Performing the CVD process with parameters outside of these ranges may not allow the barrier layer 114B to be formed to the desired thickness or quality.

In some embodiments, the barrier layer 114B is formed of tantalum nitride, which is deposited by an ALD process. Specifically, the barrier layer 114B may be formed by placing the substrate 50 in a deposition chamber and cyclically dispensing multiple source precursors into the deposition chamber. A first pulse of an ALD cycle is performed by dispensing a tantalum source precursor into the deposition chamber. Acceptable tantalum source precursors include pentakis(dimethylamido)tantalum (PDMAT) ($C_{10}H_{30}N_5Ta$), tantalum chloride ($TaCl_5$), and the like. The first pulse can be performed at a temperature in the range of about 250° C. to about 450° C. and at a pressure in the range of about 2 torr to about 35 torr, e.g., by maintaining the deposition chamber at such a temperature and pressure. The first pulse can be performed for a duration in the range of about 0.1 seconds to about 60 seconds, e.g., by keeping the tantalum source precursor in the deposition chamber for such a duration. The tantalum source precursor is then purged from the deposition chamber, such as by an acceptable vacuuming process and/or by flowing an inert gas into the deposition chamber. A second pulse of the ALD cycle is performed by dispensing a nitrogen source precursor into the deposition chamber. Acceptable nitrogen source precursors include ammonia ($NH_3$) and the like. The second pulse can be performed at a temperature in the range of about 250° C. to about 450° C. and at a pressure in the range of about 2 torr to about 35 torr, e.g., by maintaining the deposition chamber at such a temperature and pressure. The second pulse can be performed for a duration in the range of about 0.1 seconds to about 60 seconds, e.g., by keeping the nitrogen source precursor in the deposition chamber for such a duration. The nitrogen source precursor is then purged from the deposition chamber, such as by an acceptable vacuuming process and/or by flowing an inert gas into the deposition chamber. Each ALD cycle results in the deposition of an atomic layer (sometimes called a monolayer) of tantalum nitride. The ALD cycles are repeated until the barrier layer 114B has a desired thickness (previously described). The ALD cycles can be repeated from about 5 to about 180 times. Performing the ALD process with parameters in these ranges allows the barrier layer 114B to be formed to a desired thickness (previously described) and quality. Performing the ALD process with parameters outside of these ranges may not allow the barrier layer 114B to be formed to the desired thickness or quality.

In some embodiments, the barrier layer 114B is formed of fluorine-free tungsten, which is deposited by an ALD process. Specifically, the barrier layer 114B may be formed by placing the substrate 50 in a deposition chamber and cyclically dispensing multiple source precursors into the deposition chamber. Fluorine-free tungsten is tungsten that is free of fluorine, and is deposited with a fluorine-free tungsten source precursor, e.g., a tungsten source precursor that is free of fluorine. Depositing tungsten with a fluorine-free tungsten source precursor avoids the undesired production of corrosive fluoride byproducts during deposition. A first pulse of an ALD cycle is performed by dispensing a fluorine-free tungsten source precursor into the deposition chamber. Acceptable fluorine-free tungsten source precursors include tungsten chloride such as tungsten(V) chloride ($WCl_5$) and the like. The first pulse can be performed at a temperature in the range of about 350° C. to about 500° C. and at a pressure in the range of about 5 torr to about 40 torr, e.g., by maintaining the deposition chamber at such a temperature and pressure. The first pulse can be performed for a duration in the range of about 0.1 seconds to about 60 seconds, e.g., by keeping the fluorine-free tungsten source precursor in the deposition chamber for such a duration. The fluorine-free tungsten source precursor is then purged from the deposition chamber, such as by an acceptable vacuuming process and/or by flowing an inert gas into the deposition chamber. A second pulse of the ALD cycle is performed by dispensing a hydrogen source precursor into the deposition chamber. Acceptable hydrogen source precursors include hydrogen gas ($H_2$) and the like. The second pulse can be performed at a temperature in the range of about 350° C. to about 500° C. and at a pressure in the range of about 5 torr to about 40 torr, e.g., by maintaining the deposition chamber at such a temperature and pressure. The second pulse can be performed for a duration in the range of about 0.1 seconds to about 60 seconds, e.g., by keeping the hydrogen source precursor in the deposition chamber for such a duration. The hydrogen source precursor is then purged from the deposition chamber, such as by an acceptable vacuuming process and/or by flowing an inert gas into the deposition chamber. Each ALD cycle results in the deposition of an atomic layer (sometimes called a monolayer) of tungsten. The ALD cycles are repeated until the barrier layer 114B has a desired thickness (previously described). The ALD cycles can be repeated from about 5 to about 180 times. Performing the ALD process with parameters in these ranges allows the barrier layer 114B to be formed to a desired thickness (previously described) and quality. Performing the ALD process with parameters outside of these ranges may not allow the barrier layer 114B to be formed to the desired thickness or quality.

Figure 17B:
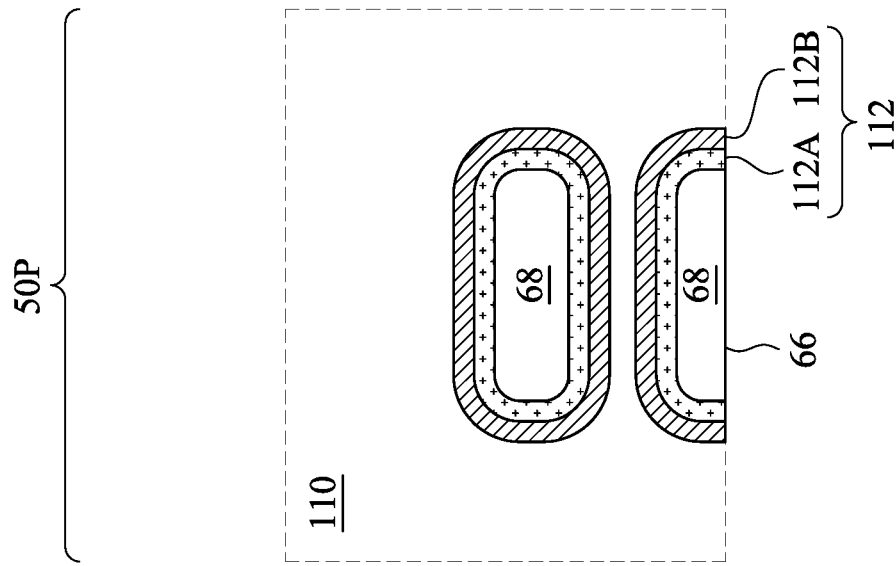
Figure 17A:
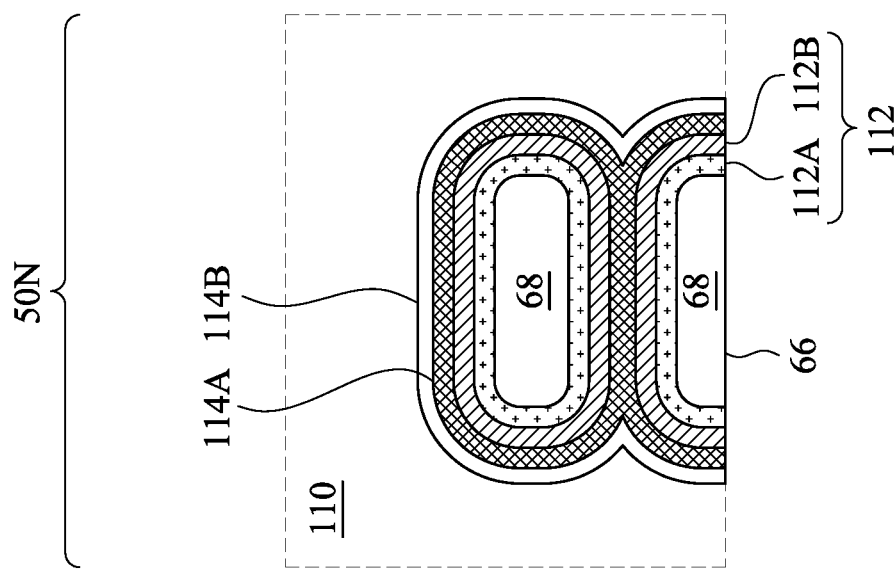

In FIGS. 17A and 17B and step 208 of the method 200, portions of the barrier layer 114B and the first work function tuning layer 114A are removed from the second region (e.g., the p-type region 50P). Removing the portions of the barrier layer 114B and the first work function tuning layer 114A from the second region (e.g., the p-type region 50P) expands the recesses 110 in the second region to re-expose the gate dielectric layer 112 in the second region (e.g., the p-type region 50P). The removal may be performed by acceptable photolithography and etching techniques. The etching may include any acceptable etch process, such as a reactive ion etch (RIE), neutral beam etch (NBE), the like, or a combination thereof. The etching may be anisotropic.

In some embodiments, a single etch is performed to remove the portions of the barrier layer 114B and the first work function tuning layer 114A. The single etch may be selective to the materials of the barrier layer 114B and the first work function tuning layer 114A (e.g., selectively etches the materials of the barrier layer 114B and the first work function tuning layer 114A at a faster rate than the material(s) of the gate dielectric layer 112). For example, when the barrier layer 114B is formed of tantalum nitride and the first work function tuning layer 114A is formed of titanium aluminum, they may both be removed by a wet etch using ammonium hydroxide ($NH_4OH$).

In some embodiments, a first etch is performed to remove the portions of the barrier layer 114B and a second etch is performed to remove the portions of the first work function tuning layer 114A. The first etch may be selective to the barrier layer 114B (e.g., selectively etches the material of the barrier layer 114B at a faster rate than the material of the first work function tuning layer 114A). For example, when the barrier layer 114B is formed of amorphous silicon, it may be removed by a wet etch using dilute hydrofluoric (dHF) acid. The second etch may be selective to the first work function tuning layer 114A (e.g., selectively etches the material of the first work function tuning layer 114A at a faster rate than the material of the gate dielectric layer 112). For example, when the first work function tuning layer 114A is formed of titanium aluminum, it may be removed by a wet etch using ammonium hydroxide ($NH_4OH$).

Figure 18B:
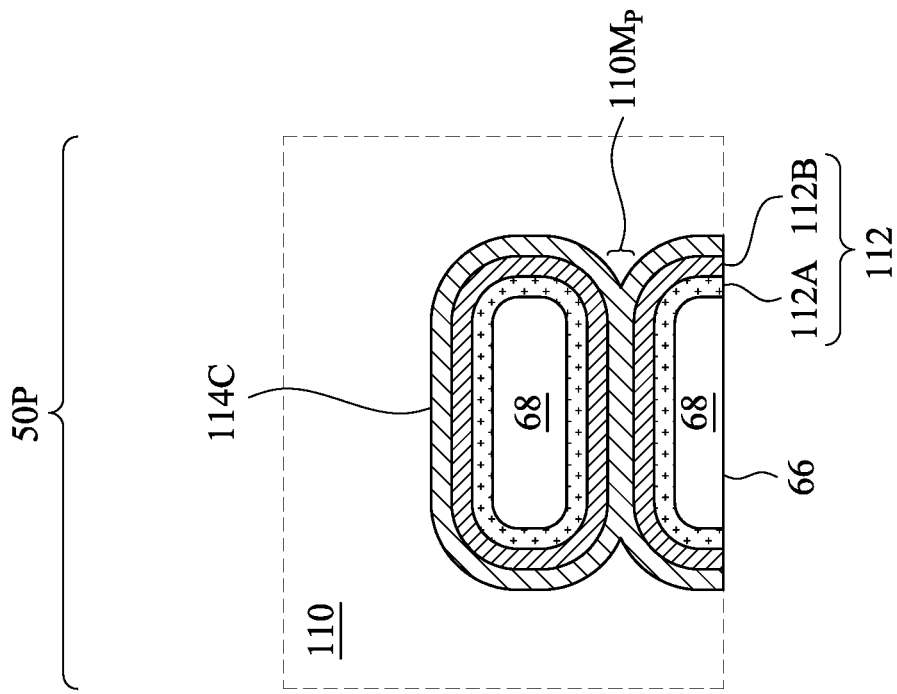
Figure 18A:
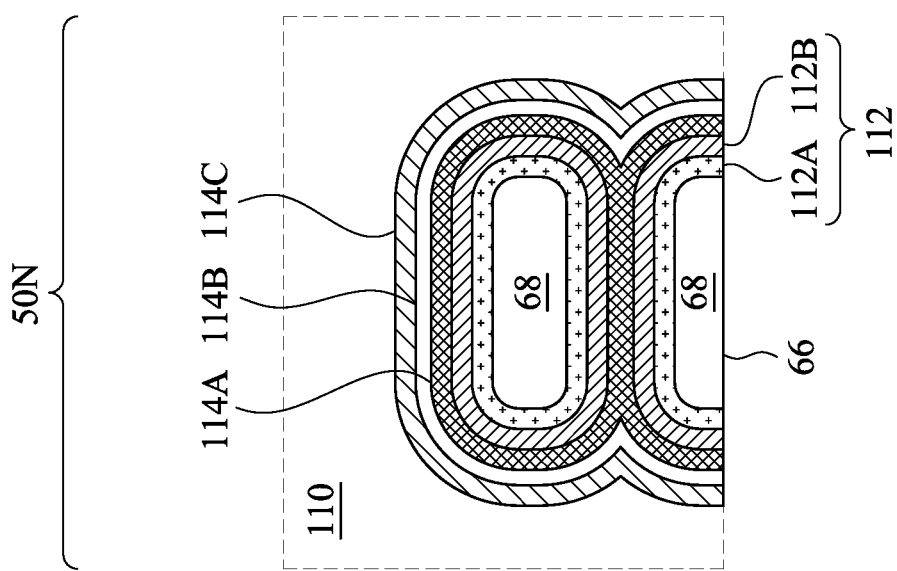

In FIGS. 18A and 18B and step 210 of the method 200, a second work function tuning layer 114C is deposited on the barrier layer 114B in the first region (e.g., the n-type region 50N) and on the gate dielectric layer 112 in the second region (e.g., the p-type region 50P). As will be subsequently described in greater detail, p-type devices will be formed having the second work function tuning layer 114C in the second region (e.g., the p-type region 50P), and n-type devices will be formed having the first work function tuning layer 114A and the second work function tuning layer 114C in the first region (e.g., the n-type region 50N). The second work function tuning layer 114C may be referred to as a "p-type work function tuning layer" when it is the only work function tuning layer in the second region (e.g., the p-type region 50P). The second work function tuning layer 114C includes any acceptable material to tune a work function of a device to a desired amount given the application of the device to be formed, and may be deposited using any acceptable deposition process. For example, when the second work function tuning layer 114C is a p-type work function tuning layer, it may be formed of a p-type work function metal (PWFM) such as titanium nitride (TiN), tantalum nitride (TaN), combinations thereof, or the like, which may be deposited by ALD, CVD, PVD, or the like. Although the second work function tuning layer 114C is shown as being single layered, the second work function tuning layer 114C can be multilayered. For example, the second work function tuning layer 114C can include a layer of titanium nitride (TiN) and a layer of tantalum nitride (TaN).

The second work function tuning layer 114C is formed to a thickness that is sufficient to cause merging of the portions of the second work function tuning layer 114C between the second nanostructures 66 in the second region (e.g., the p-type region 50P). As a result, the portions $110M_P$ of the recesses 110 between the second nanostructures 66 are completely filled by the second work function tuning layer 114C, so that no glue layers (subsequently described in greater detail) can be formed in the portions $110M_P$ of the recesses 110 between the second nanostructures 66. By not depositing glue layers between the second nanostructures 66, manufacturing ease can be improved, particularly in advanced semiconductor nodes with small feature sizes, as glue layer materials can be difficult to deposit in small spaces. Respective portions of the gate dielectric layer 112 wrap around each of the second nanostructures 66, and respective portions of the second work function tuning layer 114C fill areas between the respective portions of the gate dielectric layer 112 in the second region (e.g., the p-type region 50P). In some embodiments, the second work function tuning layer 114C is formed to a thickness in a range of about 10 Å to about 200 Å, such as in a range of about 20 Å to about 25 Å. Forming the second work function tuning layer 114C to a thickness of less than about 20 Å may not result in merging of portions of the second work function tuning layer 114C. Forming the second work function tuning layer 114C to a thickness of greater than about 25 Å may negatively impact the threshold voltages of the resulting devices. The barrier layer 114B may have a lesser thickness than the second work function tuning layer 114C.

The material of the first work function tuning layer 114A is different from the material of the second work function tuning layer 114C. As noted above, the first work function tuning layer 114A can be formed of a n-type work function metal (NWFM) and the second work function tuning layer 114C can be formed of p-type work function metal (PWFM). The NWFM is different from the PWFM. Further, the material of the barrier layer 114B is different from the material of the first work function tuning layer 114A and the material of the second work function tuning layer 114C.

Figure 19B:
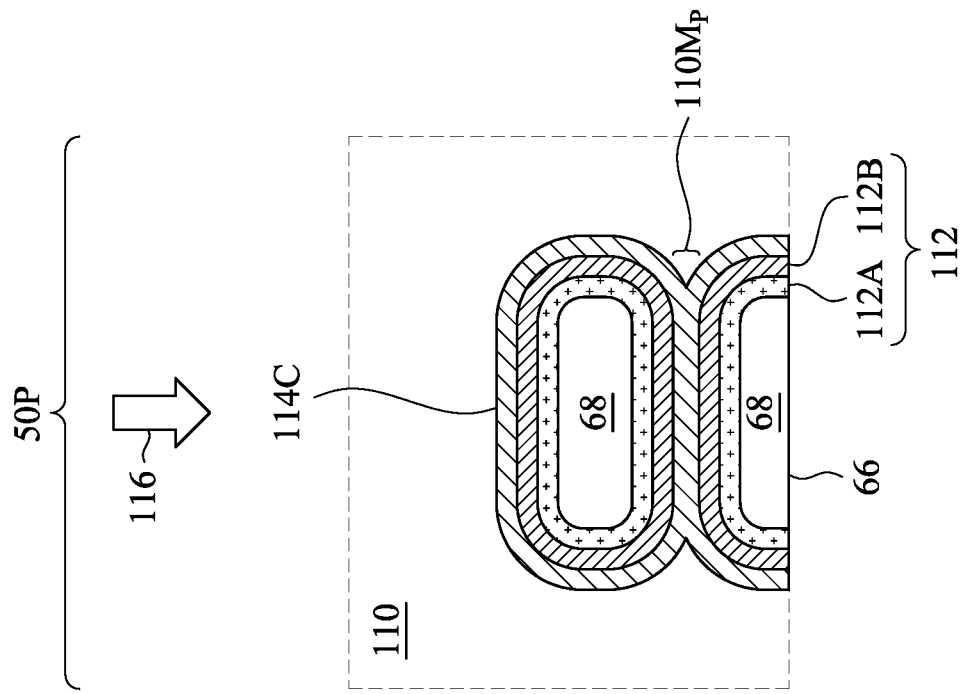
Figure 19A:
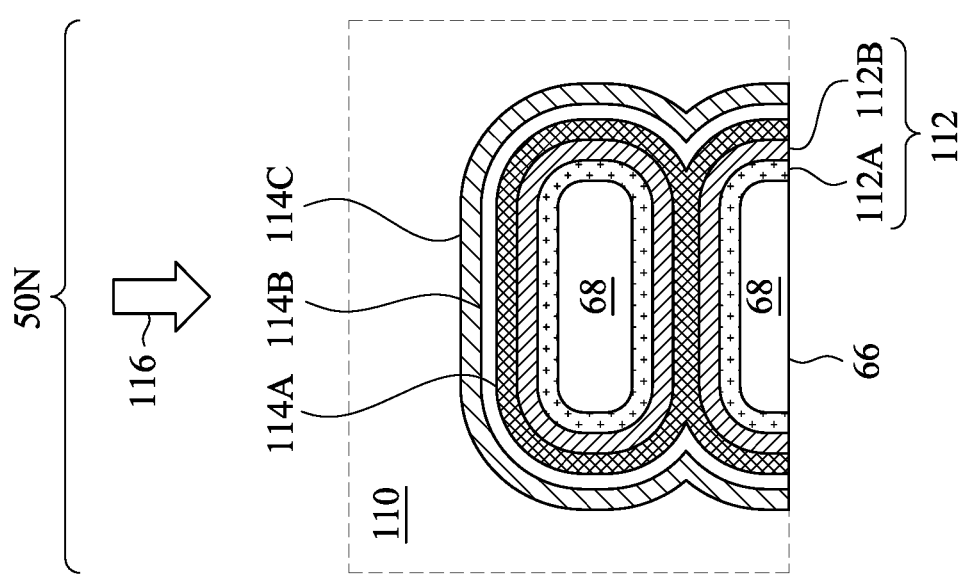

In FIGS. 19A and 19B and step 212 of the method 200, a treatment process 116 is performed on the second work function tuning layer 114C. The treatment process 116 incorporates one or more work function tuning element(s) into the second work function tuning layer 114C, thereby modifying the work function of the second work function tuning layer 114C. As subsequently described in greater detail, the barrier layer 114B inhibits penetration of the work function tuning element(s) into the first work function tuning layer 114A during the treatment process 116. In some embodiments, the treatment process 116 includes a fluorination treatment process (which incorporates fluorine), an oxidation treatment process (which incorporates oxygen), combinations thereof, or the like.

In some embodiments, the treatment process 116 includes a fluorination treatment process, in which the second work function tuning layer 114C is exposed to fluorine. The fluorination treatment process may be performed in a chamber such as an etch chamber. A gas source is dispensed in the chamber. The gas source includes a fluorine source gas and a carrier gas. The fluorine source gas may be fluorine ($F_2$) gas, nitrogen trifluoride ($NF_3$), tungsten(VI) fluoride ($WF_6$), combinations thereof, or the like. The carrier gas may be an inert gas such as argon (Ar), helium (He), xenon (Xe), neon (Ne), krypton (Kr), Radon (Rn), combinations thereof, or the like. The fluorine in the gas source is incorporated into the second work function tuning layer 114C, thereby modifying the work function of the second work function tuning layer 114C.

In some embodiments, the treatment process 116 includes an oxidation treatment process, in which the second work function tuning layer 114C is exposed to oxygen. For example, a low-temperature anneal may be performed in an ambient containing oxygen and an inert gas. The inert gas may be argon (Ar), helium (He), xenon (Xe), neon (Ne), krypton (Kr), Radon (Rn), combinations thereof, or the like. The low-temperature anneal may be performed at a temperature of from about 150° C. to about 500° C. The oxygen in the ambient is incorporated into the second work function tuning layer 114C, thereby modifying the work function of the second work function tuning layer 114C.

The barrier layer 114B inhibits treatment of the first work function tuning layer 114A by the treatment process 116. Specifically, the barrier layer 114B covers the first work function tuning layer 114A during the treatment process 116 to inhibit penetration of work function tuning element(s) into the first work function tuning layer 114A. For example, when the treatment process 116 includes a fluorination treatment process, the barrier layer 114B is formed of a material that is resistant to fluorination, such as amorphous silicon. Thus, when the first work function tuning layer 114A is formed of a material that includes aluminum, the formation of Al—F bonds may be inhibited. Similarly, when the treatment process 116 includes an oxidation treatment process, the barrier layer 114B is formed of a material that is resistant to oxidation, such as tantalum nitride or fluorine-free tungsten. Thus, when the first work function tuning layer 114A is formed of a material that includes aluminum, the formation of Al—O bonds may be inhibited. Modification of the work function of the first work function tuning layer 114A may be inhibited. The threshold voltages of the resulting devices may thus be more accurately tuned.

In some embodiments, the barrier layer 114B reduces modification of the work function of the first work function tuning layer 114A during the treatment process 116. Specifically, some work function tuning element(s) may be incorporated into the first work function tuning layer 114A, but the amount that is incorporated is small, such that the work function of the first work function tuning layer 114A after the treatment process 116 differs by a small amount from the work function of the first work function tuning layer 114A before the treatment process 116. For example, the treatment process 116 may modify (e.g., increase or decrease) the work function of the first work function tuning layer 114A by less than about 15%.

In some embodiments, the barrier layer 114B substantially prevents modification of the work function of the first work function tuning layer 114A during the treatment process 116. Specifically, no work function tuning element(s) are incorporated into the first work function tuning layer 114A, such that the work function of the first work function tuning layer 114A is the same before and after the treatment process 116. The first work function tuning layer 114A is thus free of the work function tuning element(s) incorporated into the second work function tuning layer 114C.

Whether the barrier layer 114B reduces or substantially prevents modification of the work function of the first work function tuning layer 114A during the treatment process 116 can depend on the thickness of the barrier layer 114B. Specifically, a thicker barrier layer 114B is more resistant to the treatment process 116.

Figure 20B:
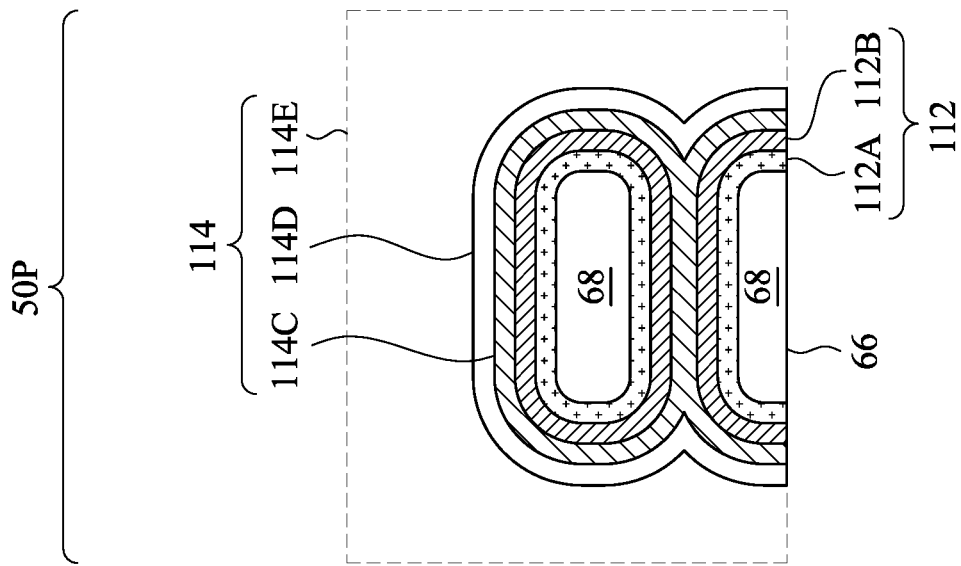
Figure 20A:
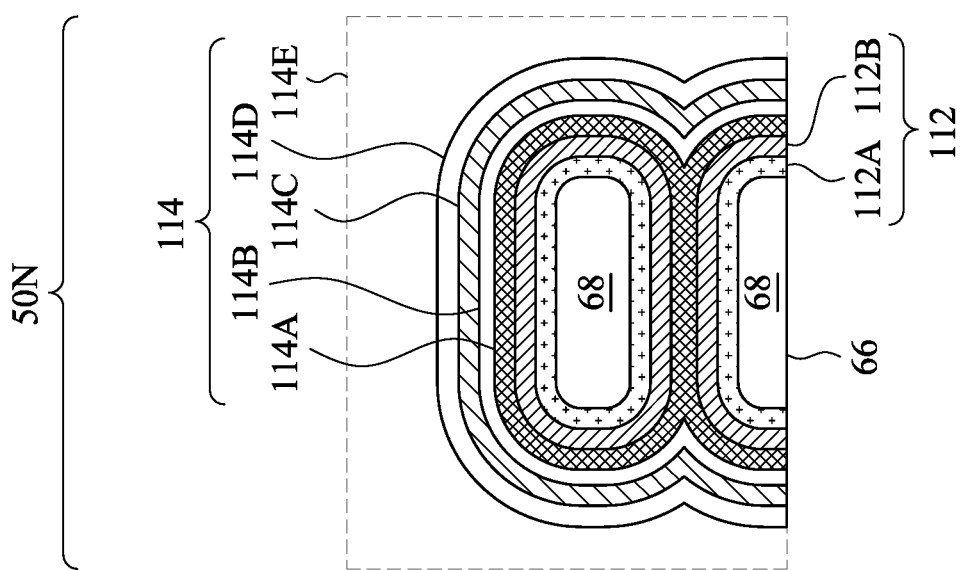

In FIGS. 20A and 20B and step 214 of the method 200, a fill layer 114E is deposited on the second work function tuning layer 114C. Optionally, a glue layer 114D is formed between the fill layer 114E and the second work function tuning layer 114C. After formation is complete, the gate electrode layer 114 includes the first work function tuning layer 114A, the barrier layer 114B, the second work function tuning layer 114C, the glue layer 114D, and the fill layer 114E.

The glue layer 114D includes any acceptable material to promote adhesion and prevent diffusion. For example, the glue layer 114D may be formed of a metal or metal nitride such as titanium nitride, titanium aluminide, titanium aluminum nitride, silicon-doped titanium nitride, tantalum nitride, or the like, which may be deposited by ALD, CVD, PVD, or the like.

The fill layer 114E includes any acceptable material of a low resistance. For example, the fill layer 114E may be formed of a metal such as tungsten, aluminum, cobalt, ruthenium, combinations thereof or the like, which may be deposited by ALD, CVD, PVD, or the like. The fill layer 114E fills the remaining portions of the recesses 110.

Although the barrier layer 114B is used to protect the first work function tuning layer 114A during processing, it may not significantly affect the electrical characteristics of the resulting devices, and may be left in the portions of the gate electrode layer 114 in the first region (e.g., the n-type region 50N). The barrier layer 114B is disposed between and physically separates the portions of the first work function tuning layer 114A and the second work function tuning layer 114C in the first region (e.g., the n-type region 50N). Conversely, the second region (e.g., the p-type region 50P) is free of the first work function tuning layer 114A and the barrier layer 114B, such that the second work function tuning layer 114C and the gate dielectric layer 112 in the second region (e.g., the p-type region 50P) are not separated by a barrier layer, and may be in physical contact. Thus, in the second region (e.g., the p-type region 50P), the material of the second work function tuning layer 114C may extend continuously between the gate dielectric layer 112 and the glue layer 114D.

Figure 21B:
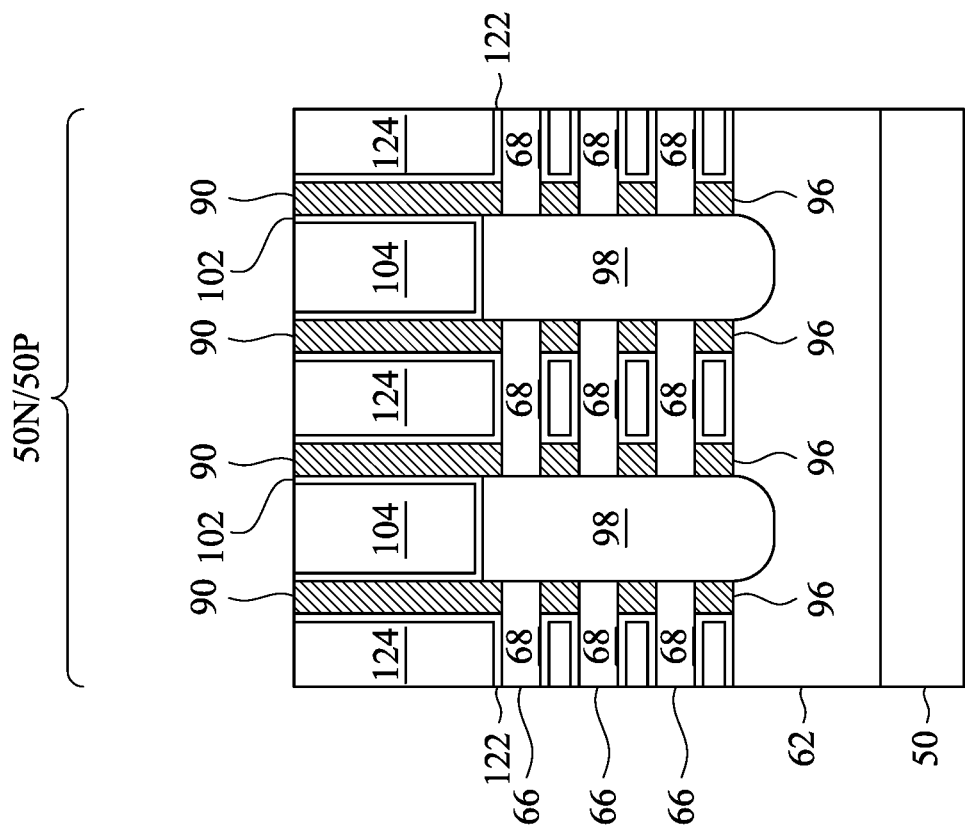
Figure 21A:
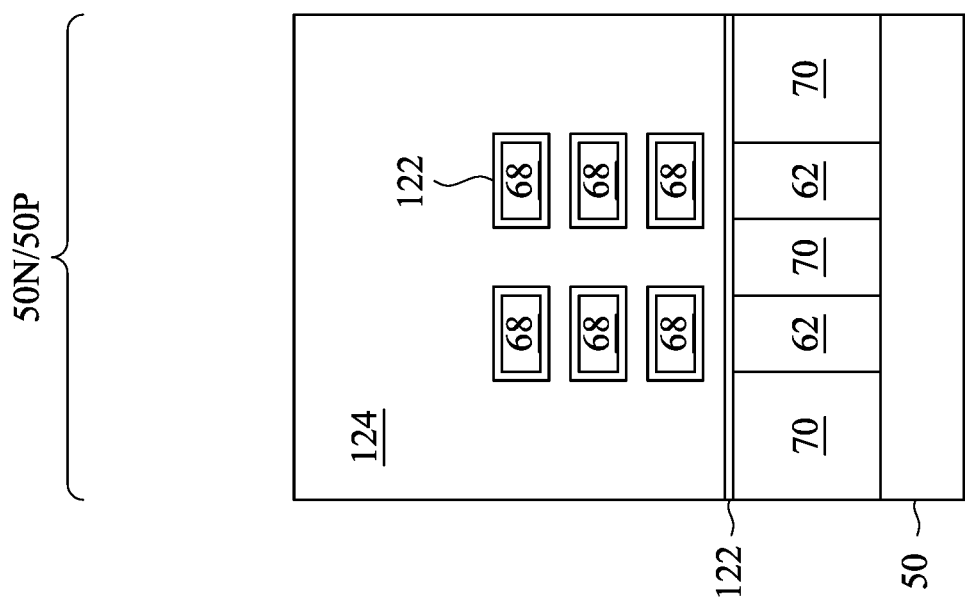

In FIGS. 21A and 21B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 110 (thus forming the gate dielectrics 122). The gate electrode layer 114, when planarized, has portions left in the recesses 110 (thus forming the gate electrodes 124). The top surfaces of the gate spacers 90; the CESL 102; the first ILD 104; the gate dielectrics 122 (e.g., the interfacial layers 112A and the high-k dielectric layers 112B, see FIGS. 20A and 20B); and the gate electrodes 124 (e.g., the first work function tuning layer 114A, the barrier layer 114B, the second work function tuning layer 114C, the glue layer 114D, and the fill layer 114E, see FIGS. 20A and 20B) are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 22B:
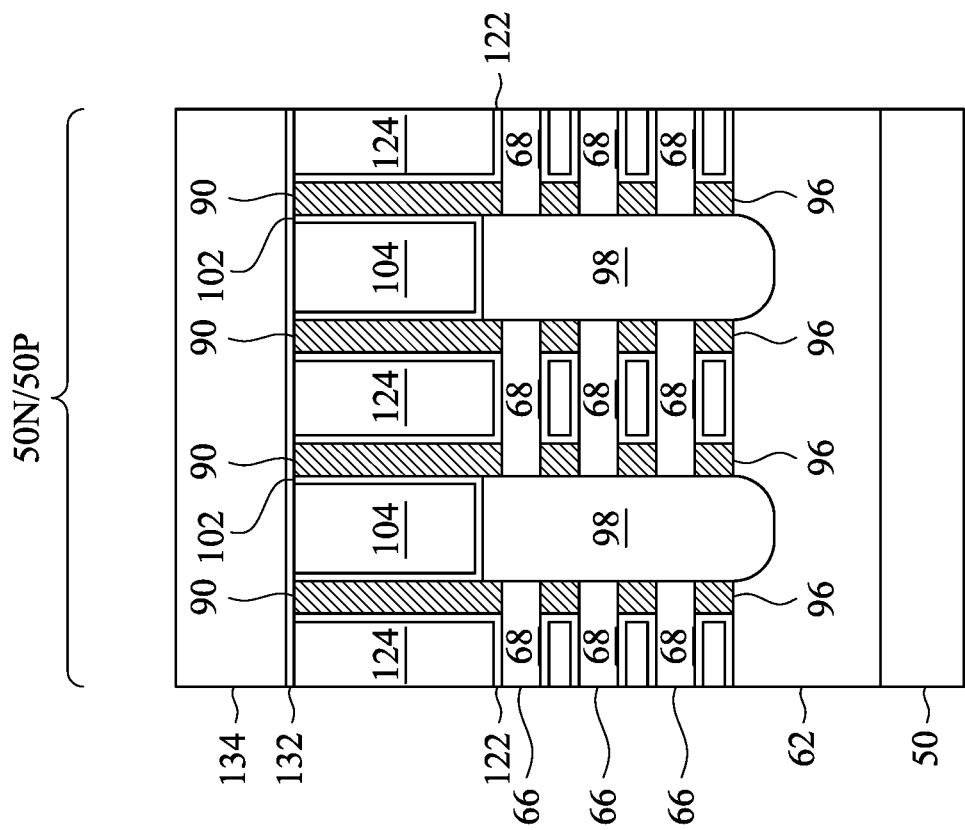
Figure 22A:
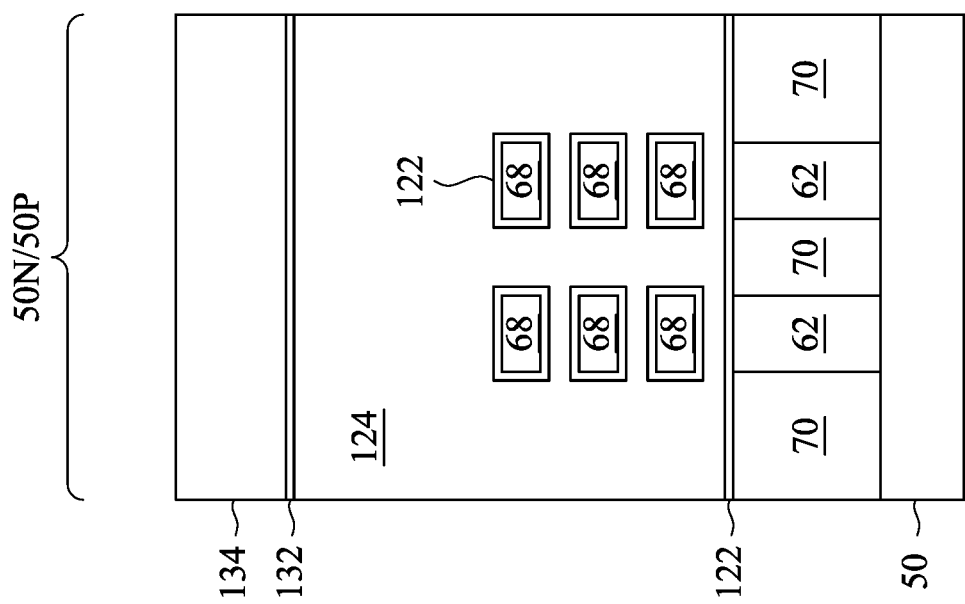

In FIGS. 22A and 22B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 23B:
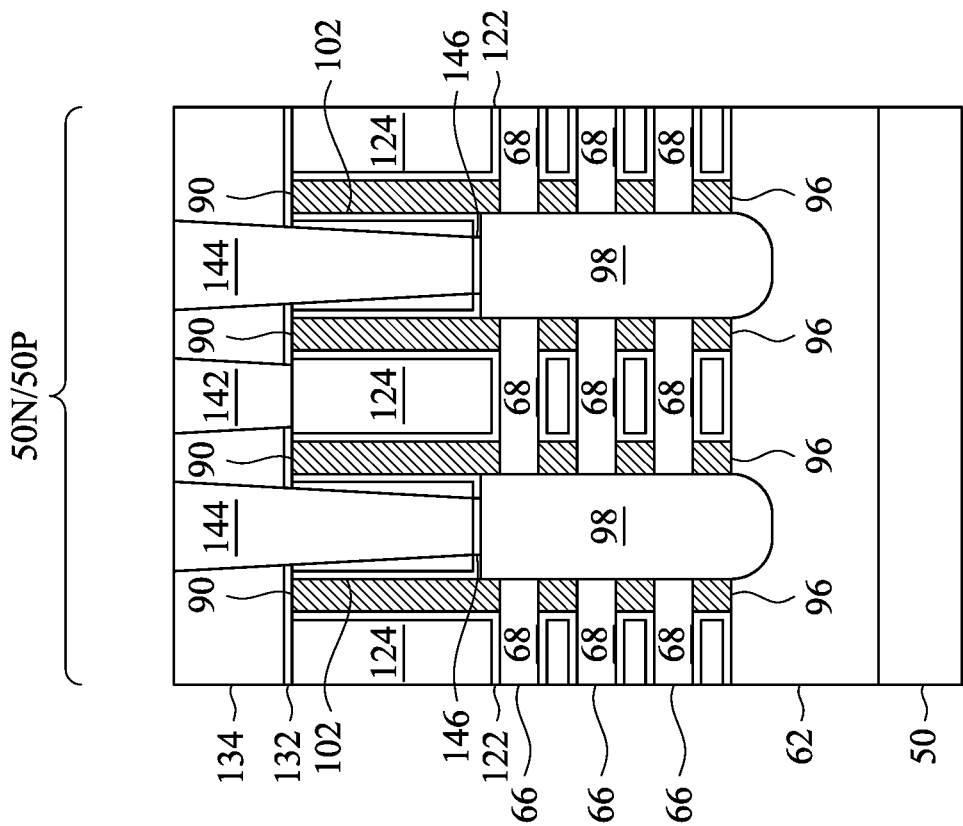
Figure 23A:
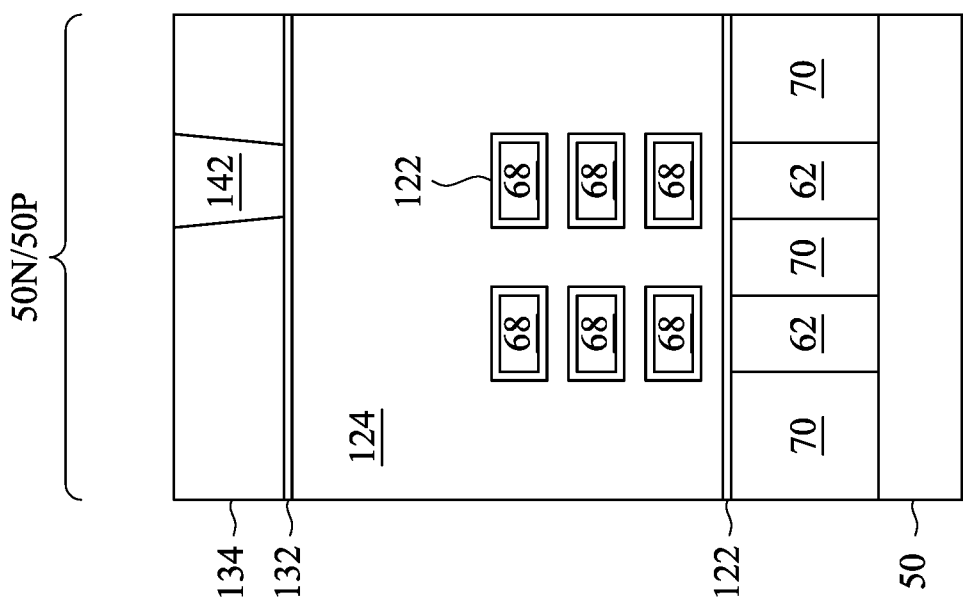

In FIGS. 23A and 23B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

As noted above, some embodiments contemplate aspects used in planar devices, such as planar FETs or in fin field-effect transistors (FinFETs). FIGS. 25A through 26B are views of FinFETs, in accordance with some embodiments. FIGS. 25A and 25B show a similar view as FIGS. 23A and 23B, and FIGS. 26A and 26B show a similar view as FIGS. 20A and 20B, except for FinFETs instead of nano-FETs. In this embodiment, the fins 62 comprise the channel regions 68, and the gate structures extend along the sidewalls and the top surfaces of the fins 62.

Embodiments may achieve advantages. Treating the second work function tuning layer 114C with the treatment process 116 allows for the incorporation of one or more work function tuning element(s) into the second work function tuning layer 114C, thereby allowing the work function of the second work function tuning layer 114C to be tuned to a desired amount. Forming the barrier layer 114B between the first work function tuning layer 114A and the second work function tuning layer 114C protects the first work function tuning layer 114A from the treatment process 116, thus helping inhibit modification of the work function of the first work function tuning layer 114A. The threshold voltages of the resulting devices in both the n-type region 50N and the p-type region 50P may thus be more accurately tuned.

In an embodiment, a device includes: a channel region; a gate dielectric layer on the channel region; a first work function tuning layer on the gate dielectric layer, the first work function tuning layer including a n-type work function metal; a barrier layer on the first work function tuning layer; a second work function tuning layer on the barrier layer, the second work function tuning layer including a p-type work function metal, the p-type work function metal different from the n-type work function metal; and a fill layer on the second work function tuning layer. In some embodiments of the device, the barrier layer includes amorphous silicon. In some embodiments of the device, the barrier layer includes tantalum nitride. In some embodiments of the device, the barrier layer includes fluorine-free tungsten. In some embodiments, the device further includes: nanostructures on a substrate, the nanostructures including the channel region. In some embodiments of the device, respective portions of the gate dielectric layer wrap around each of the nanostructures, and respective portions of the first work function tuning layer fill areas between the respective portions of the gate dielectric layer. In some embodiments, the device further includes: a fin extending from a substrate, the fin including the channel region. In some embodiments of the device, the barrier layer has a thickness in a range of 15 Å to 80 Å.

In an embodiment, a device includes: a first transistor including: a first channel region; a first gate dielectric layer on the first channel region; a n-type work function tuning layer on the first gate dielectric layer; a barrier layer on the n-type work function tuning layer; a first p-type work function tuning layer on the barrier layer; and a first fill layer on the first p-type work function tuning layer; and a second transistor including: a second channel region; a second gate dielectric layer on the second channel region; a second p-type work function tuning layer on the second gate dielectric layer; and a second fill layer on the second p-type work function tuning layer. In some embodiments of the device, the first p-type work function tuning layer and the second p-type work function tuning layer include a work function tuning element, the n-type work function tuning layer free of the work function tuning element. In some embodiments of the device, the work function tuning element is oxygen. In some embodiments of the device, the work function tuning element is fluorine. In some embodiments of the device, the first transistor further includes a first source/drain region adjacent the first channel region, the first source/drain region including n-type impurities, and the second transistor further includes a second source/drain region adjacent the second channel region, the second source/drain region including p-type impurities.

In an embodiment, a method includes: depositing a gate dielectric layer having a first portion and a second portion, the first portion deposited on a first channel region, the second portion deposited on a second channel region; forming a first work function tuning layer on the first portion of the gate dielectric layer; forming a barrier layer on the first work function tuning layer; depositing a second work function tuning layer on the barrier layer and the second portion of the gate dielectric layer; and performing a treatment process on the second work function tuning layer to modify a second work function of the second work function tuning layer, the barrier layer inhibiting modification of a first work function of the first work function tuning layer during the treatment process. In some embodiments of the method, depositing the barrier layer includes depositing amorphous silicon by a CVD process, the CVD process performed with silane, the CVD process performed at a temperature in a range of 300° C. to 500° C., the CVD process performed at a pressure in a range of 2 torr to 35 torr, the barrier layer deposited to a thickness in a range of 15 Å to 80 Å. In some embodiments of the method, depositing the barrier layer includes depositing tantalum nitride by an ALD process, the ALD process performed with pentakis(dimethylamido)tantalum and ammonia, the ALD process performed at a temperature in a range of 250° C. to 450° C., the ALD process performed at a pressure in a range of 2 torr to 35 torr, the barrier layer deposited to a thickness in a range of 15 Å to 80 Å. In some embodiments of the method, depositing the barrier layer includes depositing fluorine-free tungsten by an ALD process, the ALD process performed with tungsten(V) chloride and hydrogen, the ALD process performed at a temperature in a range of 350° C. to 500° C., the ALD process performed at a pressure in a range of 5 torr to 40 torr, the barrier layer deposited to a thickness in a range of 15 Å to 80 Å. In some embodiments of the method, the treatment process includes a fluorination treatment process. In some embodiments of the method, the treatment process includes an oxidation treatment process. In some embodiments of the method, forming the first work function tuning layer includes depositing the first work function tuning layer on the first portion and the second portion of the gate dielectric layer, and forming the barrier layer includes: depositing the barrier layer on the first work function tuning layer; and removing portions of the barrier layer and the first work function tuning layer to expose the second portion of the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   nanostructures comprising a channel region;
   a gate dielectric layer on the channel region, wherein respective portions of the gate dielectric layer wrap around each of the nanostructures;
   a first work function tuning layer on the gate dielectric layer, the first work function tuning layer comprising an n-type work function metal, wherein respective portions of the first work function tuning layer fill areas between the respective portions of the gate dielectric layer;
   a barrier layer on the first work function tuning layer;

a second work function tuning layer on the barrier layer, the second work function tuning layer comprising a p-type work function metal and a work function tuning element, the p-type work function metal different from the n-type work function metal, the second work function tuning layer having more of the work function tuning element than the first work function tuning layer; and a fill layer on the second work function tuning layer.

2. The device of claim 1, wherein the first work function tuning layer further comprises the work function tuning element.

3. The device of claim 1, wherein the first work function tuning layer is free of the work function tuning element.

4. The device of claim 1, wherein the work function tuning element is oxygen or fluorine.

5. The device of claim 1, wherein the barrier layer comprises a barrier material, the barrier material being different from the n-type work function metal, the barrier material being different from the p-type work function metal.

6. The device of claim 5, wherein the barrier material is amorphous silicon, tantalum nitride, or fluorine-free tungsten.

7. The device of claim 1, further comprising:
a fin extending from a substrate, the fin comprising the channel region.

8. The device of claim 1, wherein a thickness of the barrier layer is less than a thickness of the first work function tuning layer and is less than a thickness of the second work function tuning layer.

9. A device comprising:
a first transistor comprising:
first nanostructures;
a first gate dielectric layer having respective first portions wrapped around each of the first nanostructures;
an n-type work function tuning layer on the first gate dielectric layer, respective portions of the n-type work function tuning layer completely filling areas between the respective first portions of the first gate dielectric layer;
a barrier layer on the n-type work function tuning layer; and
a first p-type work function tuning layer on the barrier layer; and
a second transistor comprising:
second nanostructures;
a second gate dielectric layer having respective second portions wrapped around each of the second nanostructures; and
a second p-type work function tuning layer on the second gate dielectric layer, respective portions of the second p-type work function tuning layer completely filling areas between the respective second portions of the second gate dielectric layer.

10. The device of claim 1, wherein the first work function tuning layer and the second work function tuning layer are separated by the barrier layer, wherein the barrier layer has a thickness in a range of 15 Å to 80 Å.

11. The device of claim 9, wherein the first p-type work function tuning layer comprises a work function tuning element, the second p-type work function tuning layer comprises the work function tuning element, and the n-type work function tuning layer has less of the work function tuning element than the first p-type work function tuning layer and the second p-type work function tuning layer.

12. The device of claim 11, wherein the work function tuning element is oxygen or fluorine.

13. The device of claim 9, wherein the first transistor further comprises a first source/drain region adjacent the first nanostructures, the first source/drain region comprising n-type impurities, and wherein the second transistor further comprises a second source/drain region adjacent the second nanostructures, the second source/drain region comprising p-type impurities.

14. A method comprising:
depositing a gate dielectric layer on a first channel region;
depositing a first work function tuning layer on the gate dielectric layer;
forming a barrier layer on the first work function tuning layer;
depositing a second work function tuning layer on the barrier layer; and
performing a treatment process on the second work function tuning layer to modify a second work function of the second work function tuning layer, the barrier layer covering the first work function tuning layer during the treatment process.

15. The method of claim 14, wherein the treatment process incorporates a work function tuning element into the second work function tuning layer.

16. The method of claim 15, wherein the work function tuning element is oxygen or fluorine.

17. The method of claim 14, wherein forming the barrier layer comprises depositing amorphous silicon by a CVD process.

18. The method of claim 14, wherein forming the barrier layer comprises depositing tantalum nitride by an ALD process.

19. The method of claim 14, wherein forming the barrier layer comprises depositing fluorine-free tungsten by an ALD process.

20. The method of claim 14, further comprising:
depositing the gate dielectric layer on a second channel region; and
removing the barrier layer and the first work function tuning layer from above the second channel region, wherein the barrier layer and the first work function tuning layer remain above the first channel region.

* * * * *